United States Patent
Nimbalker et al.

(10) Patent No.: US 11,223,374 B2
(45) Date of Patent: Jan. 11, 2022

(54) FLEXIBLE BLOCK SIZE SUPPORT FOR POLAR CODE

(71) Applicant: Intel Corporation, Santa Clara, CA (US)

(72) Inventors: Ajit Nimbalker, Fremont, CA (US); Dmitry Dikarev, Nizhny Novgorod (RU); Grigory Ermolaev, Nizhny Novgorod (RU)

(73) Assignee: Apple Inc., Cupertino, CA (US)

( * ) Notice: Subject to any disclaimer, the term of this patent is extended or adjusted under 35 U.S.C. 154(b) by 96 days.

(21) Appl. No.: 16/488,561

(22) PCT Filed: Mar. 23, 2018

(86) PCT No.: PCT/US2018/024202
§ 371 (c)(1),
(2) Date: Aug. 23, 2019

(87) PCT Pub. No.: WO2018/176003
PCT Pub. Date: Sep. 27, 2018

(65) Prior Publication Data
US 2021/0143843 A1 May 13, 2021

Related U.S. Application Data

(60) Provisional application No. 62/475,457, filed on Mar. 23, 2017.

(51) Int. Cl.
*H03M 13/00* (2006.01)
*H03M 13/13* (2006.01)
(Continued)

(52) U.S. Cl.
CPC ....... *H03M 13/6356* (2013.01); *H03M 13/13* (2013.01); *H04L 1/0008* (2013.01); *H04L 1/0063* (2013.01); *H04W 72/0413* (2013.01)

(58) Field of Classification Search
CPC . H03M 13/6356; H03M 13/13; H04L 1/0063; H04L 1/0008; H04W 72/0413
See application file for complete search history.

(56) References Cited

U.S. PATENT DOCUMENTS 5,295,188 A * 3/1994 Wilson ................... H04L 9/302
235/379
2015/0077277 A1 3/2015 Alhussien et al.

FOREIGN PATENT DOCUMENTS

EP 2922227 9/2015

OTHER PUBLICATIONS

WO 2018129147 A1, Pan, "Error Check-Based Synchronization and Broadcast Channel" , (Year: 2017).*

(Continued)

*Primary Examiner* — Walter J Divito
(74) *Attorney, Agent, or Firm* — Sterne, Kessler, Goldstein & Fox P.L.L.C.

(57) ABSTRACT

Described is an apparatus of an Evolved Node-B (eNB) operable to communicate with a User Equipment (UE) on a wireless network. The apparatus may comprise a first circuitry, a second circuitry, a third circuitry, and a fourth circuitry. The first circuitry may be operable to identify a data block having a number N1 of bits. The second circuitry may be operable to determine a number N2 of filler bits based on a set of one or more parameters and the N1 of bits of the data block. The third circuitry may be operable to pad the data block with the N2 filler bits to form a padded data block having a number N3 of bits. The fourth circuitry may be operable to encode the N3 bits of the padded data block to form a polar codeword having a number N4 of bits.

24 Claims, 12 Drawing Sheets

(51) Int. Cl.
*H04L 1/00* (2006.01)
*H04W 72/04* (2009.01)

(56) References Cited

OTHER PUBLICATIONS

International Search Report and Written Opinion for PCT Application No. PCT/US18/24202, dated Jul. 4, 2018.
Huawei, et al., "Channel coding for very small control block lengths", 3GPP Draft; R1-1701705, Athens, Greece, Feb. 12, 2017.
Huawei, et al., "Summary of polar code design for control channels", 3GPP Draft; R1-1700088; vol. RAN WG1; Spokane, WA, Jan. 16, 2017.
Intel Corp., "Channel coding scheme for EMBB", 3GPP Draft; R1-1610377, vol. RAN WG1, Lisbon, Oct. 9, 2016.
Intel Corp., "Polar code design", 3GPP Draft; R1-1700386; vol. RAN WG1, Spokane, WA, Jan. 16, 2017.

\* cited by examiner

| input bit index | block size K | | | | | | | |
|---|---|---|---|---|---|---|---|---|
| | 57 | 58 | 59 | 60 | 61 | 62 | 63 | 64 |
| 191 | | F | F | F | F | F | F | |
| 192 | F | F | F | F | F | F | F | F |
| 193 | F | F | F | F | F | F | F | F |
| 194 | F | F | F | F | F | F | F | F |
| 195 | F | F | F | F | F | F | F | F |
| 196 | F | F | F | F | F | F | F | F |
| 197 | F | F | F | F | F | F | F | F |
| 198 | F | F | F | F | F | F | F | F |
| 199 | | | | | | | | |
| 200 | F | F | F | F | F | F | F | F |
| 201 | F | F | F | F | F | F | F | F |
| 202 | F | F | F | F | F | F | F | F |
| 203 | | | | | | | | |
| 204 | F | F | F | F | F | F | F | F |
| 205 | | | | | | | | |
| 206 | | | | | | | | |
| 207 | | | | | | | | |
| 208 | F | F | F | F | F | F | F | F |
| 209 | F | F | F | F | F | F | F | F |

| input bit index | block size K | | | | | | | |
|---|---|---|---|---|---|---|---|---|
| | 57 | 58 | 59 | 60 | 61 | 62 | 63 | 64 |
| 210 | F | F | F | F | F | F | F | F |
| 211 | | | | | | | | |
| 212 | F | F | F | F | F | F | F | F |
| 213 | | | | | | | | |
| 214 | | | | | | | | |
| 215 | | | | | | | | |
| 216 | PC | PC | PC | PC | PC | PC | PC | PC |
| 217 | | | | | | | | |
| 218 | | | | | | | | |
| 219 | | | | | | | | |
| 220 | | | | | | | | |
| 221 | | | | | | | | |
| 222 | | | | | | | | |
| 223 | | | | | | | | |
| 224 | F | F | F | F | F | F | F | F |
| 225 | F | F | F | F | F | F | F | F |
| 226 | PC | PC | PC | PC | PC | PC | PC | PC |
| 227 | | | | | | | | PC |
| 228 | PC | PC | PC | PC | PC | PC | PC | PC |

FLEXIBLE BLOCK SIZE SUPPORT FOR POLAR CODE

CLAIM OF PRIORITY

The present application is a National Stage Entry of and claims priority to PCT Application No. PCT/US18/24202 and entitled FLEXIBLE BLOCK SIZE SUPPORT FOR POLAR CODE, which claims priority under 35 U.S.C. § 119(e) to U.S. Provisional Patent Application Ser. No. 62/475,457 filed Mar. 23, 2017 and entitled "FLEXIBLE BLOCK SIZE SUPPORT FOR POLAR CODE," which are herein incorporated by reference in their entirety.

BACKGROUND

A variety of wireless cellular communication systems have been implemented, including 3rd Generation Partnership Project (3GPP) Universal Mobile Telecommunications Systems (UMTS), 3GPP Long-Term Evolution (LTE) systems, and 3GPP LTE-Advanced (LTE-A) systems. Next-generation wireless cellular communication systems based upon LTE and LTE-A systems are being developed, such as Fifth Generation (5G) wireless systems/5G mobile networks systems. Various cellular communication systems may implement Polar codes.

BRIEF DESCRIPTION OF THE DRAWINGS

The embodiments of the disclosure will be understood more fully from the detailed description given below and from the accompanying drawings of various embodiments of the disclosure. However, while the drawings are to aid in explanation and understanding, they are only an aid, and should not be taken to limit the disclosure to the specific embodiments depicted therein.

FIG. 2 illustrates an exemplary scenario of locations of data bits, parity-check bits, and frozen bits, in accordance with some embodiments of the disclosure.

FIG. 3 illustrates an exemplary scenario of locations of data bits, parity-check bits, and frozen bits, in accordance with some embodiments of the disclosure.

DETAILED DESCRIPTION

Figure 1:
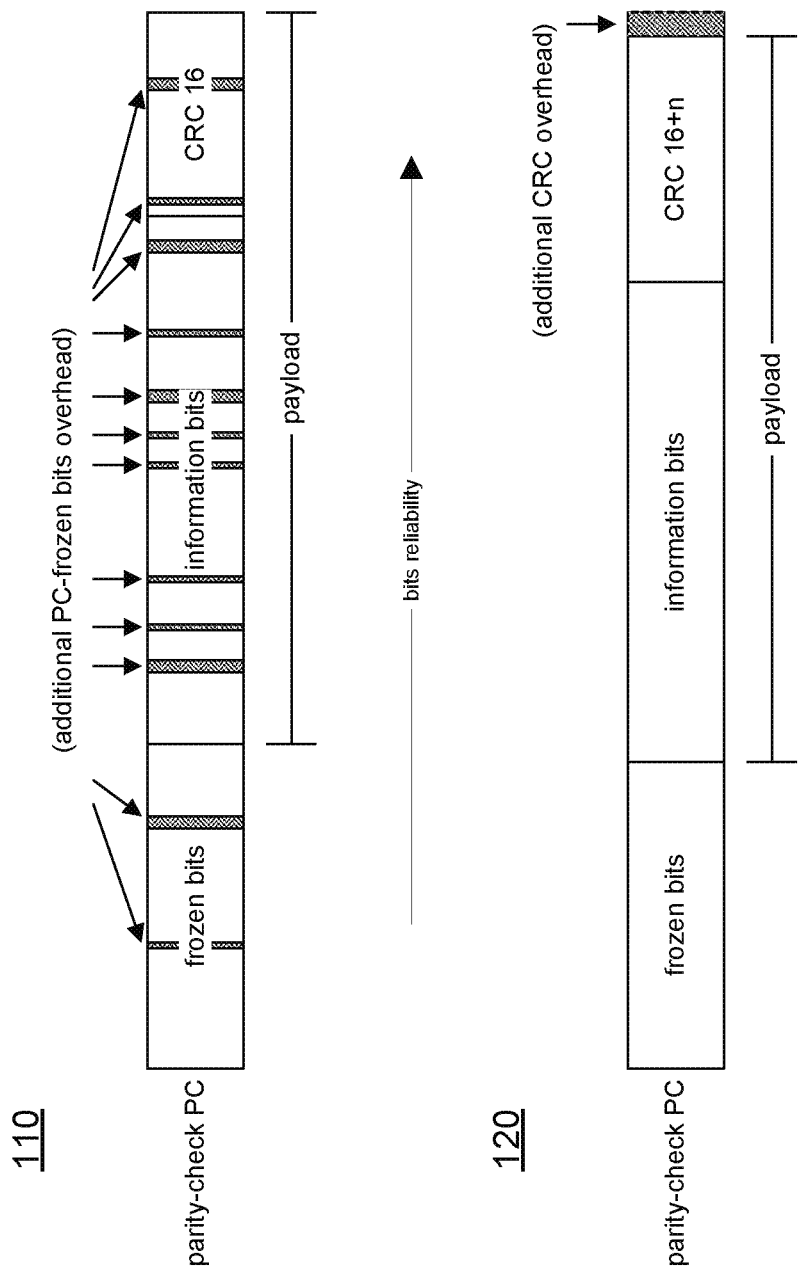
FIG. 1 illustrates scenarios of Polar codes, in accordance with some embodiments of the disclosure.

Various wireless cellular communication systems have been implemented or are being proposed, including 3rd Generation Partnership Project (3GPP) Universal Mobile Telecommunications Systems (UMTS), 3GPP Long-Term Evolution (LTE) systems, 3GPP LTE-Advanced (LTE-A) systems, and 5th Generation (5G) wireless systems/5G mobile networks systems/5G New Radio (NR) systems.

Various wireless cellular communication systems may incorporate Polar codes, which may increase complexity in encoding and decoding due to inherent code construction issues and inter-dependency. For example, encoding complexity and/or decoding complexity may vary significantly with small changes in block sizes and/or code rates.

Discussed herein are various mechanisms and methods to support filler bit attachment in Polar encoding schemes (e.g., for Polar encoders and/or Polar decoders). An advantage of the discussed mechanisms and methods is that they may significantly reduce a complexity of code design and/or storage and/or decoder implementations. By applying zero-padding, a coarse set of block sizes to be supported natively by an underlying Polar encoder and/or Polar decoder (e.g., combinations to be supported by the Polar encoder and/or Polar decoder), design complexity may be reduced while still accommodating flexibility in input sizes.

In the following description, numerous details are discussed to provide a more thorough explanation of embodiments of the present disclosure. It will be apparent to one skilled in the art, however, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate a greater number of constituent signal paths, and/or have arrows at one or more ends, to indicate a direction of information flow. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical, mechanical, or magnetic connection between the things that are connected, without any intermediary devices. The term "coupled" means either a direct electrical, mechanical, or magnetic connection between the things that are connected or an indirect connection through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The terms "substantially," "close," "approximately," "near," and "about" generally refer to being within +/−10% of a target value. Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking, or in any other manner.

It is to be understood that the terms so used are interchangeable under appropriate circumstances such that the embodiments of the invention described herein are, for example, capable of operation in other orientations than those illustrated or otherwise described herein.

The terms "left," "right," "front," "back," "top," "bottom," "over," "under," and the like in the description and in the claims, if any, are used for descriptive purposes and not necessarily for describing permanent relative positions.

For purposes of the embodiments, the transistors in various circuits, modules, and logic blocks are Tunneling FETs (TFETs). Some transistors of various embodiments may comprise metal oxide semiconductor (MOS) transistors, which include drain, source, gate, and bulk terminals. The transistors may also include Tri-Gate and FinFET transistors, Gate All Around Cylindrical Transistors, Square Wire, or Rectangular Ribbon Transistors or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors-BJT PNP/NPN, BiCMOS, CMOS, etc., may be used for some transistors without departing from the scope of the disclosure.

For the purposes of the present disclosure, the phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

In addition, the various elements of combinatorial logic and sequential logic discussed in the present disclosure may pertain both to physical structures (such as AND gates, OR gates, or XOR gates), or to synthesized or otherwise optimized collections of devices implementing the logical structures that are Boolean equivalents of the logic under discussion.

In addition, for purposes of the present disclosure, the term "eNB" may refer to a legacy LTE capable Evolved Node-B (eNB), a next-generation or 5G capable eNB, an Access Point (AP), and/or another base station for a wireless communication system. The term "gNB" may refer to a 5G-capable or NR-capable eNB. For purposes of the present disclosure, the term "UE" may refer to a legacy LTE capable User Equipment (UE), a Station (STA), and/or another mobile equipment for a wireless communication system. The term "UE" may also refer to a next-generation or 5G capable UE.

Various embodiments of eNBs and/or UEs discussed below may process one or more transmissions of various types. Some processing of a transmission may comprise demodulating, decoding, detecting, parsing, and/or otherwise handling a transmission that has been received. In some embodiments, an eNB or UE processing a transmission may determine or recognize the transmission's type and/or a condition associated with the transmission. For some embodiments, an eNB or UE processing a transmission may act in accordance with the transmission's type, and/or may act conditionally based upon the transmission's type. An eNB or UE processing a transmission may also recognize one or more values or fields of data carried by the transmission. Processing a transmission may comprise moving the transmission through one or more layers of a protocol stack (which may be implemented in, e.g., hardware and/or software-configured elements), such as by moving a transmission that has been received by an eNB or a UE through one or more layers of a protocol stack.

Various embodiments of eNBs and/or UEs discussed below may also generate one or more transmissions of various types. Some generating of a transmission may comprise modulating, encoding, formatting, assembling, and/or otherwise handling a transmission that is to be transmitted. In some embodiments, an eNB or UE generating a transmission may establish the transmission's type and/or a condition associated with the transmission. For some embodiments, an eNB or UE generating a transmission may act in accordance with the transmission's type, and/or may act conditionally based upon the transmission's type. An eNB or UE generating a transmission may also determine one or more values or fields of data carried by the transmission. Generating a transmission may comprise moving the transmission through one or more layers of a protocol stack (which may be implemented in, e.g., hardware and/or software-configured elements), such as by moving a transmission to be sent by an eNB or a UE through one or more layers of a protocol stack.

In various embodiments, resources may span various Resource Blocks (RBs), Physical Resource Blocks (PRBs), and/or time periods (e.g., frames, subframes, and/or slots) of a wireless communication system. In some contexts, allocated resources (e.g., channels, Orthogonal Frequency-Division Multiplexing (OFDM) symbols, subcarrier frequencies, resource elements (REs), and/or portions thereof) may be formatted for (and prior to) transmission over a wireless communication link. In other contexts, allocated resources (e.g., channels, OFDM symbols, subcarrier frequencies, REs, and/or portions thereof) may be detected from (and subsequent to) reception over a wireless communication link.

FIG. 1 illustrates scenarios of Polar codes, in accordance with some embodiments of the disclosure. A first scenario 110 may support a parity-check Polar code (PC) and/or PC scheme. An overhead of additional PC-frozen bits may be distributed among frozen bits as well as a payload of information bits and CRC 16 bits. A second scenario 120 may support a parity-check PC and/or PC scheme. An overhead of additional CRC may accompany frozen bits as well as a payload of information bits and CRC 16+n bits.

Polar codes may support relatively flexible information and code block sizes. For example, a one-bit granularity on an input may be possible with Polar codes. However, with such fine granularity, there may be implementations costs on the encoder side and/or on the decoder side. These costs may be amplified for some varieties of Polar codes, such as parity-check Polar codes, or distributed/hash-aided Polar codes. The cost may relate to identifying and storing locations of various types of bits and handling of these bits in the encoder and/or decoder.

In Polar codes, input locations may be marked as data locations or frozen locations. This may simplify implementation for both encoding operations and decoding operations. A single reliability bit sequence may be used to identify which bits correspond to data and which bits correspond to frozen bits. In various embodiments, the data bits may also contain a CRC that may be used to assist list decoding in selecting suitable candidates as estimated data bits. Typically, an associated CRC check may be considered a parallel operation that may be performed separately from a core list Polar decoding algorithm.

In contrast, in some new methods such as parity-check Polar coding, there may be an addition input location type, such as parity-check bits, in addition to data bits and frozen bits (e.g., frozen locations). These parity-check bits may be interspersed, and may also form an additional linkage between a set of data bits and a set of parity-check bits. This may lead to additional complexity as a number of parity-check bits and actual location for those bits within an input may vary as a function of a data block size and a code rate.

In the example provided in Table 1 below, the first column (Kp) indicates a number of data bits, and the remaining columns indicate various coding rates. In turn, the rows indicate, for various numbers of data bits, the number of parity-check bits that may support a particular code rate. For example, for a number of data bits Kp=40, to support a code rate of 1/5, a first algorithm may be disposed to provide 31 parity-check bits, while a second algorithm may be disposed to provide 25 parity-check bits.

frozen bits (for the first algorithm), or 256−40−25=191 frozen bits (for the second algorithm).

In general, a number of PC bits in a PC Polar code may be determined in accordance with the following equation:

$$F_p = \log_2 N \times (\alpha - |\alpha \times (K/M - \frac{1}{2})|^2)$$

Where: K may be a number of information bits; N may be a mother code size of the Polar code used for encoding K information bits (e.g., data bits) to generate M bits for transmission; and M may be a number of bits that are transmitted. In some embodiments, Fp may be a threshold used in determining a number of parity-check bits, but the actual number of parity-check bits may be determined based on a procedure having two stages. In a first stage, a small number of relatively more-reliable bit positions may be marked for parity-check bits (and/or PC-frozen bits), and an additional, larger number of relatively less-reliable bit positions may be marked for parity-check bits (and/or PC-frozen bits).

In various embodiments, for block sizes (e.g., numbers of data bits) between 40 and 100 bits, to support coded sequences of lengths of {576,288,144,72} (which may be obtained, for example, by Polar coding and rate-matching),

TABLE 1 example of number of parity-check bits by Kp and various code rates

| Kp | 1/6 | 1/5 | 1/3 | 2/5 | 1/2 | 2/3 | 3/4 | 5/6 | 8/9 |
|---|---|---|---|---|---|---|---|---|---|
| 32 | 25 (27) | 22 (22) | 15 (15) | 10 | 4 | 3 | 3 | 1 | 2 |
| 40 | 50 (26) | 31 (25) | 20 (20) | 17 | 5 | 8 | 4 | 2 | 3 |
| 48 | 21 (35) | 43 (25) | 31 | 18 | 11 | 8 | 4 | 3 | 3 |
| 56 | 29 (28) | 58 (27) | 38 | 24 | 17 | 11 | 4 | 4 | 3 |
| 64 | 49 (73) | 64 (26) | 22 (22) | 25 | 19 | 11 | 5 | 4 | 3 |
| 72 | 58 (91) | 70 (80) | 26 (26) | 32 | 21 | 12 | 8 | 4 | 2 |
| 80 | 74 (91) | 92 (80) | 29 (29) | 40 | 24 | 13 | 10 | 4 | 4 |
| 88 | 90 (100) | 51 (84) | 41 | 49 | 30 | 18 | 11 | 4 | 4 |
| 96 | 99 (118) | 62 (80) | 43 | 54 | 31 | 19 | 13 | 6 | 5 |
| 100 | 102 (121) | 71 (79) | 47 | 52 | 32 | 18 | 14 | 7 | 5 |
| 104 | 106 (121) | 82 (101) | 54 | 32 | 33 | 19 | 14 | 7 | 5 |
| 112 | 123 (122) | 82 (109) | 55 | 65 | 38 | 22 | 13 | 8 | 5 |
| 120 | 138 (120) | 95 (112) | 56 | 78 | 47 | 24 | 15 | 7 | 5 |
| 128 | 152 (119) | 102 (104) | 81 (81) | 44 | 54 | 32 | 14 | 8 | 5 |
| 136 | 162 (125) | 110 (109) | 80 (80) | 86 | 57 | 33 | 15 | 9 | 5 |
| 144 | 179 (124) | 120 (105) | 89 (89) | 48 | 56 | 32 | 16 | 10 | 5 |
| 152 | 194 (126) | 134 (110) | 104 (104) | 53 | 58 | 20 | 18 | 11 | 5 |
| 160 | 204 (117) | 142 (107) | 112 (112) | 62 | 65 | 23 | 19 | 12 | 4 |
| 168 | 217 (224) | 156 (112) | 107 (107) | 66 | 70 | 24 | 24 | 11 | 5 |
| 176 | 239 (157) | 171 (104) | 122 | 70 | 70 | 24 | 26 | 12 | 5 |
| 184 | 250 (166) | 184 (222) | 126 | 86 | 74 | 31 | 29 | 13 | 6 |
| 192 | 267 (162) | 195 (213) | 138 | 102 | 85 | 33 | 30 | 13 | 8 |
| 200 | 276 | 200 | 139 | 107 | 90 | 34 | 34 | 15 | 8 |

A Polar code length (e.g., a mother code length) of N may be a nearest power of two that is larger than Kp divided by the code rate. The Polar code length N may then be used to determine a number of frozen bits, which may be equal to the code length, minus the number of data bits, minus the number of parity-check bits (e.g., the bits remaining after the data bits and parity-check bits are subtracted from the polar code length).

Continuing the example above, for Kp=40 data bit locations and a code rate of 1/5, Kp divided by 1/5 is 200, so the Polar code length N=256 (the nearest power of two that is larger than 200). For a Polar code length of 256, 40 data bit locations, and either 31 parity-check bit locations (for the first algorithm) or 25 parity-check bit locations (for the second algorithm), there may be either 256−40−31=185 numbers of combinations of rates and/or lengths may be approximately 60×4=120 combinations. Moreover, a design may be disposed to providing storage for each combination for locations of data bits, parity-check bits, and/or frozen bits. The arrangement of these bits (data, parity-check, and/or frozen) may impact aspects of decoding implementations related to scheduling and latency. In addition, latency may vary for numbers of data bits that are close, yet different. For example, for Kp=59 and for 576 coded bits, latency may be different than for K=60 and 576 coded bits, even though they are very close to each other in block length (e.g., number of data bits), and in addition the locations of data bits, PC-bits, and/or frozen bits might also be different. This can be true, for example, in using a simplified successive cancellation list decoder, or a multi-bit decoder.

In general, for each set of block size K (e.g., number of data bits), Polar code length/mother code length N, and number of bits transmitted M, a number of PC-bits may be different, and the locations of the PC-bits may also be different. Accommodating such differences may lead to increased complexity on the encoder side and/or the decoder side. For example, with a block size K between 28 bits and 128 bits, and a number of bits transmitted M being {576, 288,144, and/or 72}, there may be approximately 4×100=400 combinations to be supported; and for each combination, a design may be disposed to provide storage to identify the number of PC-bits and the locations of the PC-bits on a Polar code input (e.g., on an input of a Polar encoder). Moreover, a design may be disposed to providing an additional hardware decoder for many cases, which may complicate the overall design.

Figure 2:
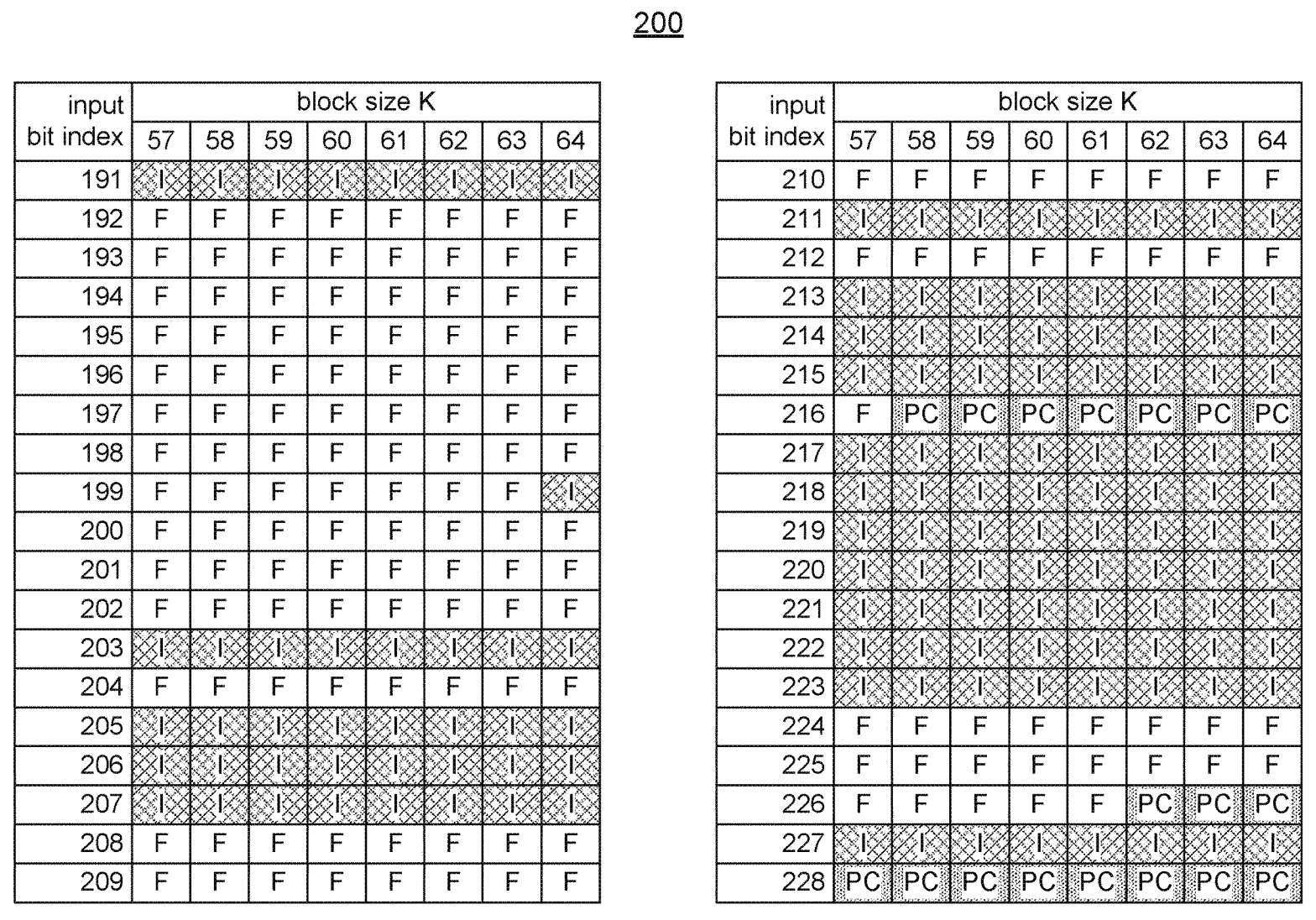

FIG. 2 illustrates an exemplary scenario of locations of data bits, parity-check bits, and frozen bits, in accordance with some embodiments of the disclosure. A scenario 200 may relate to an embodiment having a Polar code size N=256 bits, with parity-check bits occurring in different locations depending upon the data block size K.

Bit indices 191 through 228 of the 256 bits are depicted for various block sizes K (e.g., from K=57 to K=64). For each block size K, each bit index may correspond to as being for data bits (labeled "I"), parity-check bits (labeled "PC"), and frozen bits (labeled "F"). Parity-check bits may occur in different locations and may interfere with data locations.

In various embodiments, a coarse set of block sizes for inputting into a Polar code may be supported by applying a padding step prior to encoding with a Polar code (e.g., a zero-padding step). This may advantageously enable the Polar code patterns to be defined merely for a set of block sizes that a multiples of a predetermined number. For example, in some embodiments, Polar code patterns may be defined merely for data blocks having sizes that are multiples of four (e.g., comprising 28, 32, 60, 64, and so on). Data blocks having other block sizes may then be supported by padding the data block to obtain a data block having a size that is a multiple of four. The data block may be padded by adding numbers (such as "0"s or "1"s) to a beginning of a data block an end of a data block, or before or after various predetermined positions of the data block.

FIG. 3 illustrates an exemplary scenario of locations of data bits, parity-check bits, and frozen bits, in accordance with some embodiments of the disclosure. A scenario 300 may relate to an embodiment having a Polar code size N=256 bits, with parity-check bits occurring in different locations depending upon the data block size K.

Bit indices 191 through 228 of the 256 bits are depicted for various block sizes K (e.g., from K=57 to K=64). For each block size K, each bit index may correspond to as being for data bits (labeled "I"), parity-check bits (labeled "PC"), and frozen bits (labeled "F"). Parity-check bits may occur in different locations and may interfere with data locations.

Scenario 200 may correspond with a padding scheme (e.g., a zero-padding scheme), in which data blocks are padded with predetermined numbers (e.g., "0"). In comparison with scenario 200, for data block sizes K of 61 bits, 62 bits, and 63 bits, the data bits ("I") may be padded with filler bits having a predetermined value known to both the transmitting side and the receiving side (e.g., with "0") in order to form a padded data block having a size of 60 bits. A data block size of K=61 bits may use 3 filler bits, a data block size of K=62 may use 2 filler bits, and a data block size of K=63 may use one filler bit. In some embodiments, filler bits may be treated similar to frozen bits. Actual positions of filler bits within sets of data bits may be determined based on pre-determined rules (e.g., they may be placed before data bits, after data bits, or at predetermined positions or locations within a set of data bits). For some embodiments, for example, filler bits may be zero bits, and/or may be appended to an end of a set of data block bits.

An encoder and a decoder may accordingly be able to support a fine range of input block sizes (e.g., at a one-bit granularity) and/or rates merely by supporting a coarse range of input block sizes and/or rates set of sizes and/or rates. In some embodiments, the pre-determined filler bits may be treated as frozen bits in the decoding procedure, or may be handled via other means. Such a technique may advantageously improve encoder and/or decoder implementations, while reducing the risks to performance and retaining flexibility.

Figure 4:
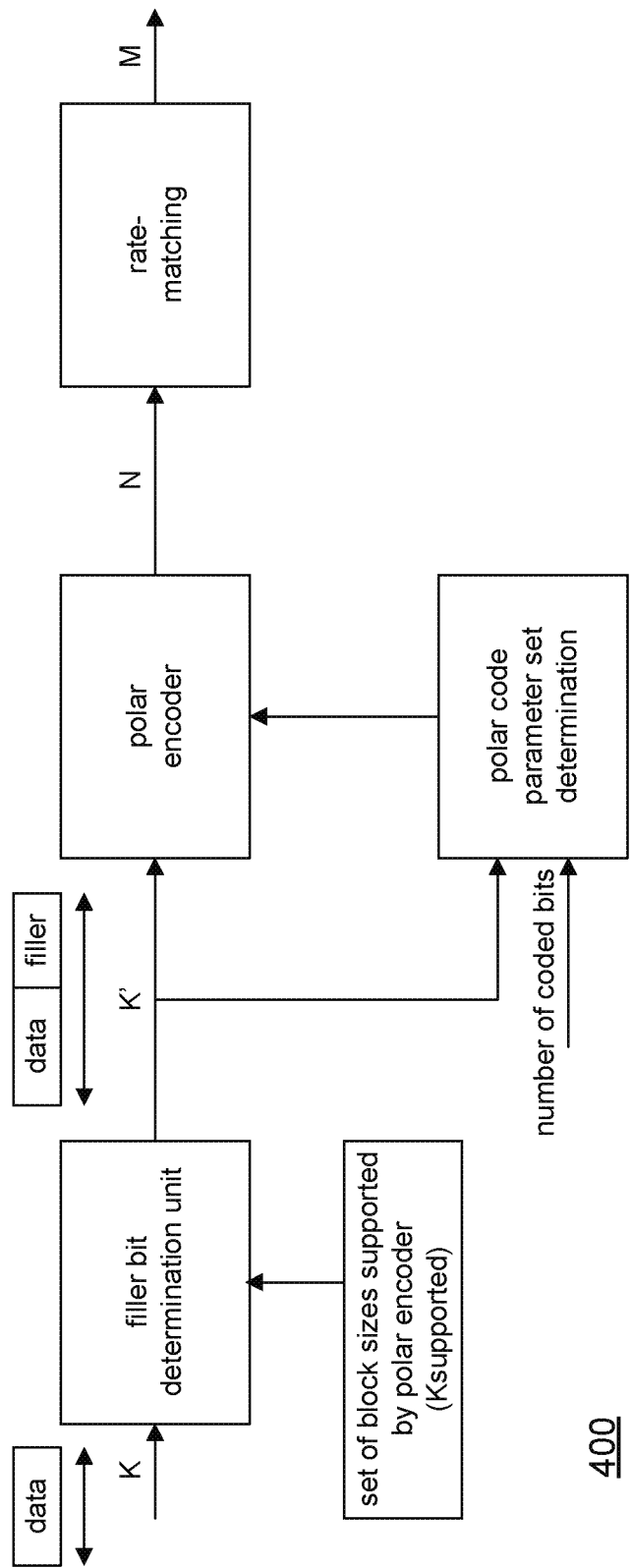
FIG. 4 illustrates an exemplary circuitry comprising a Polar encoder, in accordance with some embodiments of the disclosure.

FIG. 4 illustrates an exemplary circuitry comprising a Polar encoder, in accordance with some embodiments of the disclosure. A circuitry 400 may accommodate an input data block of length K (e.g., a data block of length Kp). The data block of length K may be provided to a filler bit determination unit, along with a set of block sizes supported by the Polar encoder for circuitry 400 (e.g., a block size Ksupported may be a multiple of four, such as {24, 28, 32, 36, and so on, through 128}). The filler bit determination unit may then determine a number of filler bits to be used based on the data block length and the block sizes supported for the Polar encoder. The filler bit determination unit may output a padded data block (e.g., a filler-bit-attached data block) of length K'. Although filler bits are depicted as being attached, in various embodiments, they may be can be placed in any order, including being interspersed among the K data bits. (The number of filler bits may be indicated as Fb; for example, for K=45, Fb=3 and K'=48.)

A Polar code parameter set determination unit may determine a Polar code sequence to use, and locations of the data bits, parity-check bits, and frozen bits may be determined for the padded data block of length K'. The Polar code parameter set determination unit may take as input a number of coded bits to determine, and any other inputs that may be used to determine a Polar code parameter set.

The padded data block of length K' and the Polar code parameter set (e.g., as determined by the Polar encoder parameter set determination unit) may be provided to a Polar encoder, which may output a Polar codeword having a number N of bits. A rate-matching unit may then take the Polar codeword having N bits as an input and may form a transmitted codeword having a desired number of bits M for transmission.

For various embodiments: the data block may have a first number of bits N1 (e.g., Kp bits as discussed herein, and/or K as depicted in FIG. 4); the filler bits may be a second number of bits N2 (e.g., Fb bits as discussed herein); the padded data block may have a third number of bits N3 (e.g., "I" as depicted in FIG. 3, and/or K' as depicted in FIG. 4); the Polar codeword may have a fourth number of bits N4 (e.g., N as discussed herein and/or depicted in FIG. 4); the parity-check bits may be a fifth number of bits N5 (e.g., "PC" as depicted in FIG. 3); and the frozen bits may be a sixth number of bits N6 (e.g., "F" as depicted in FIG. 3). Various embodiments may follow the following relationships:

$$N1+N2=N3$$

$$N3+N5+N6=N4$$

In some embodiments, a UE may implement a circuitry 400 for, e.g., Uplink (UL) transmissions, such as UCI. In some embodiments, a gNB may implement a circuitry 400 for, e.g., Downlink (DL) transmissions, such as DCI.

Figure 5:
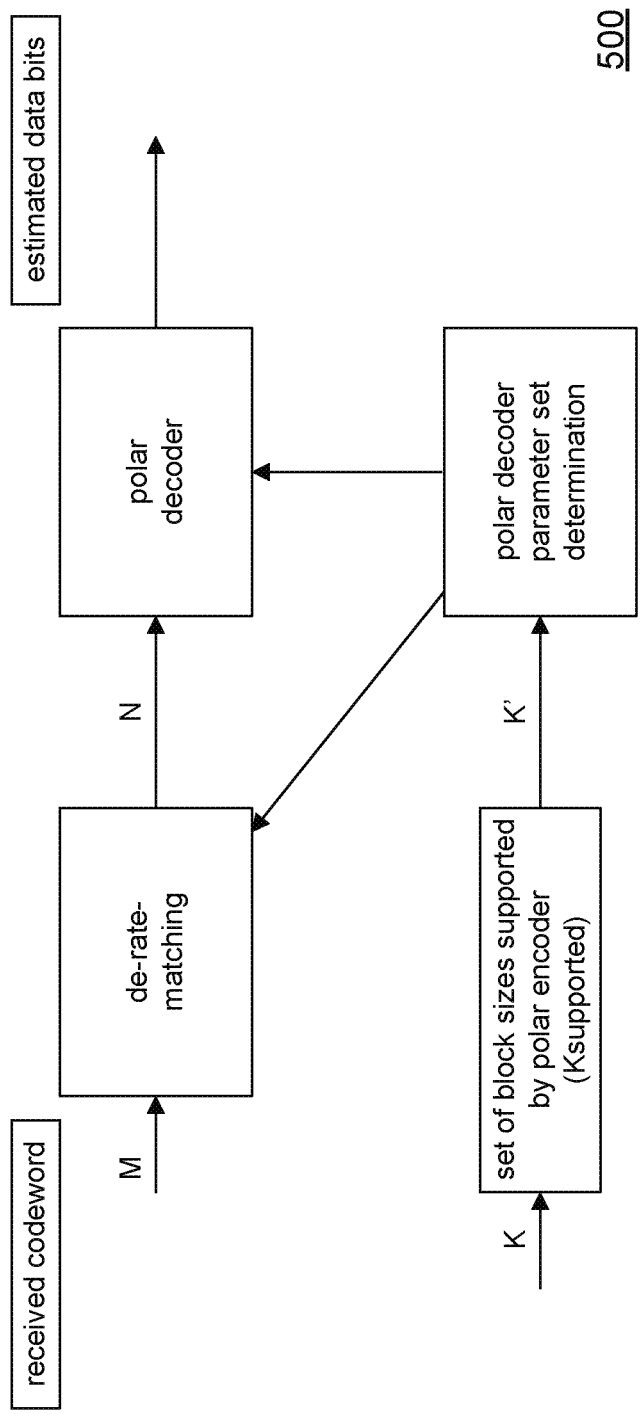
FIG. 5 illustrates an exemplary circuitry comprising a Polar decoder, in accordance with some embodiments of the disclosure.

FIG. 5 illustrates an exemplary circuitry comprising a Polar decoder, in accordance with some embodiments of the disclosure. A circuitry 500 may comprise a Polar decoder parameter set determination unit, which may determine a Polar code sequence being used, and locations of the data bits, parity-check bits, and frozen bits for a padded data block of length K'. In turn, the padded data block length of K' may be established by virtue of comparing an expected data block length K for the incoming data block against a set of block sizes supported by the Polar decoder for circuitry 500 (e.g., a block size K supported may be a multiple of four, such as {24, 28, 32, 36, and so on, through 128}).

A de-rate-matching unit may have accommodate a received codeword of length M. A de-rate-matching unit may take the received codeword of having M bits as an input and may form a Polar codeword having N bits as an output. A Polar decoder may then take the Polar codeword having N bits as an input, and based on a Polar decoder parameter set (e.g., as determined by the Polar decoder parameter set determination unit, which may include the number K of data bits and filler bits, and/or their locations), the Polar decoder may obtain an estimate of the original data. The estimate of the original data may comprise the number K of data bits and/or their locations, the number Fb of filler bits and/or their locations, or both (e.g., the number K' of data bits and filler bits and/or their locations). Circuitry 500 may accordingly determine the location of data bits, filler bits, parity check bits, and frozen bits in a received codeword.

For various embodiments: the Polar codeword may have a first number of bits M1 (e.g., N as discussed herein and/or depicted in FIG. 5); the padded data block may have a second number of bits M2 (e.g., "I" as depicted in FIG. 3, and/or K' as depicted in FIG. 5); the filler bits may be a third number of bits M3 (e.g., Fb bits as discussed herein); the data block may have a fourth number of bits M4 (e.g., Kp bits as discussed herein, and/or K as depicted in FIG. 5); the parity-check bits may be a fifth number of bits M5 (e.g., "PC" as depicted in FIG. 3); and the frozen bits may be a sixth number of bits M6 (e.g., "F" as depicted in FIG. 3). Various embodiments may follow the following relationships:

$$M4+M3=M2$$

$$M2+M5+M6=M1$$

In some embodiments, a gNB may implement a circuitry 500 for, e.g., DL transmissions, such as DCI. In some embodiments, a UE may implement a circuitry 500 for, e.g., UL transmissions, such as UCI.

Figure 6:
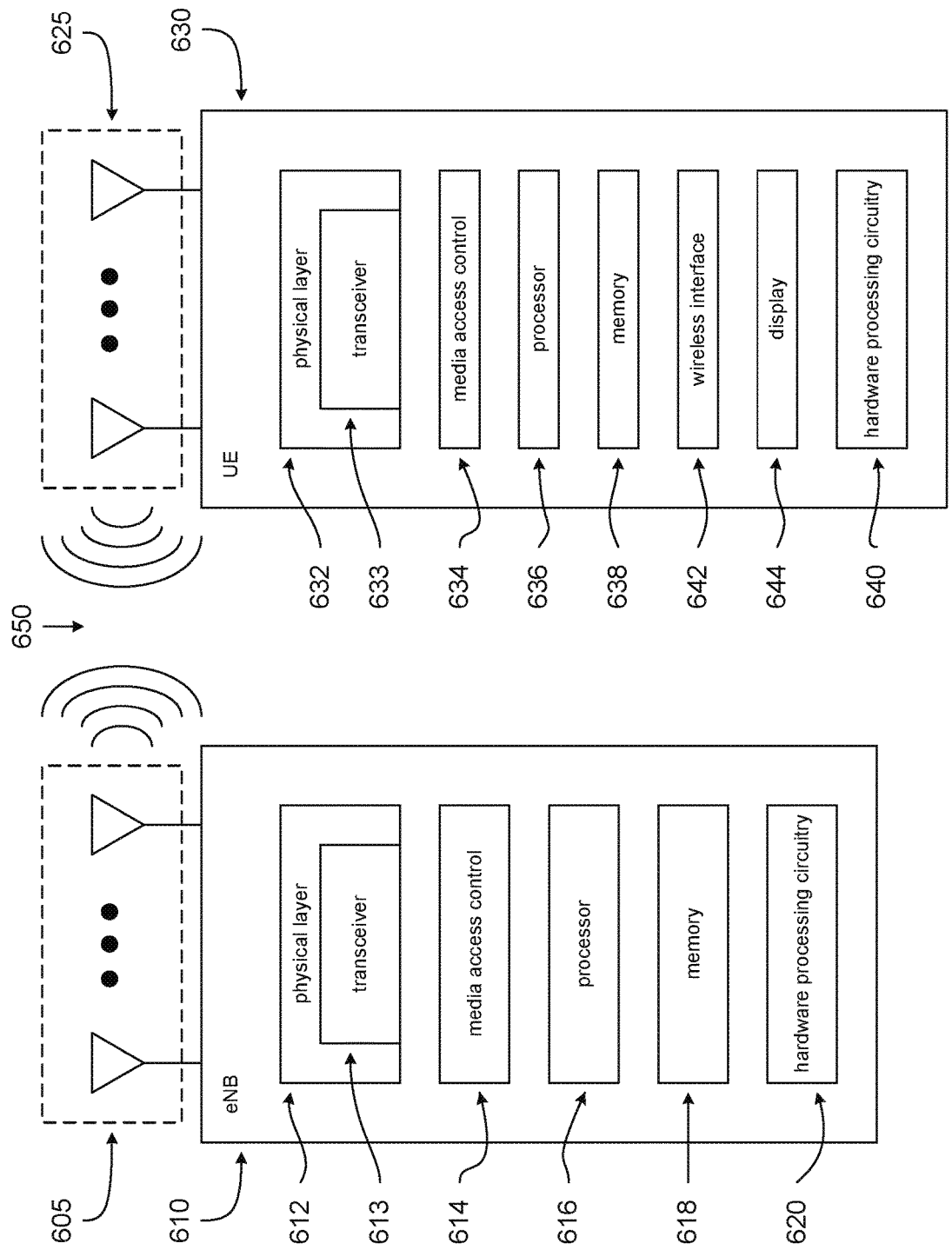
FIG. 6 illustrates an Evolved Node-B (eNB) and a User Equipment (UE), in accordance with some embodiments of the disclosure.

FIG. 6 illustrates an eNB and a UE, in accordance with some embodiments of the disclosure. FIG. 6 includes block diagrams of an eNB 610 and a UE 630 which are operable to co-exist with each other and other elements of an LTE network. High-level, simplified architectures of eNB 610 and UE 630 are described so as not to obscure the embodiments. It should be noted that in some embodiments, eNB 610 may be a stationary non-mobile device.

eNB 610 is coupled to one or more antennas 605, and UE 630 is similarly coupled to one or more antennas 625. However, in some embodiments, eNB 610 may incorporate or comprise antennas 605, and UE 630 in various embodiments may incorporate or comprise antennas 625.

In some embodiments, antennas 605 and/or antennas 625 may comprise one or more directional or omni-directional antennas, including monopole antennas, dipole antennas, loop antennas, patch antennas, microstrip antennas, coplanar wave antennas, or other types of antennas suitable for transmission of RF signals. In some MIMO (multiple-input and multiple output) embodiments, antennas 605 are separated to take advantage of spatial diversity.

eNB 610 and UE 630 are operable to communicate with each other on a network, such as a wireless network. eNB 610 and UE 630 may be in communication with each other over a wireless communication channel 650, which has both a downlink path from eNB 610 to UE 630 and an uplink path from UE 630 to eNB 610.

As illustrated in FIG. 6, in some embodiments, eNB 610 may include a physical layer circuitry 612, a MAC (media access control) circuitry 614, a processor 616, a memory 618, and a hardware processing circuitry 620. A person skilled in the art will appreciate that other components not shown may be used in addition to the components shown to form a complete eNB.

In some embodiments, physical layer circuitry 612 includes a transceiver 613 for providing signals to and from UE 630. Transceiver 613 provides signals to and from UEs or other devices using one or more antennas 605. In some embodiments, MAC circuitry 614 controls access to the wireless medium. Memory 618 may be, or may include, a storage media/medium such as a magnetic storage media (e.g., magnetic tapes or magnetic disks), an optical storage media (e.g., optical discs), an electronic storage media (e.g., conventional hard disk drives, solid-state disk drives, or flash-memory-based storage media), or any tangible storage media or non-transitory storage media. Hardware processing circuitry 620 may comprise logic devices or circuitry to perform various operations. In some embodiments, processor 616 and memory 618 are arranged to perform the operations of hardware processing circuitry 620, such as operations described herein with reference to logic devices and circuitry within eNB 610 and/or hardware processing circuitry 620.

Accordingly, in some embodiments, eNB 610 may be a device comprising an application processor, a memory, one or more antenna ports, and an interface for allowing the application processor to communicate with another device.

As is also illustrated in FIG. 6, in some embodiments, UE 630 may include a physical layer circuitry 632, a MAC circuitry 634, a processor 636, a memory 638, a hardware processing circuitry 640, a wireless interface 642, and a display 644. A person skilled in the art would appreciate that other components not shown may be used in addition to the components shown to form a complete UE.

In some embodiments, physical layer circuitry 632 includes a transceiver 633 for providing signals to and from eNB 610 (as well as other eNBs). Transceiver 633 provides signals to and from eNBs or other devices using one or more antennas 625. In some embodiments, MAC circuitry 634 controls access to the wireless medium. Memory 638 may be, or may include, a storage media/medium such as a magnetic storage media (e.g., magnetic tapes or magnetic disks), an optical storage media (e.g., optical discs), an electronic storage media (e.g., conventional hard disk drives, solid-state disk drives, or flash-memory-based storage media), or any tangible storage media or non-transitory storage media. Wireless interface 642 may be arranged to allow the processor to communicate with another device. Display 644 may provide a visual and/or tactile display for a user to interact with UE 630, such as a touch-screen display. Hardware processing circuitry 640 may comprise logic devices or circuitry to perform various operations. In some embodiments, processor 636 and memory 638 may be arranged to perform the operations of hardware processing circuitry 640, such as operations described herein with reference to logic devices and circuitry within UE 630 and/or hardware processing circuitry 640.

Accordingly, in some embodiments, UE 630 may be a device comprising an application processor, a memory, one or more antennas, a wireless interface for allowing the application processor to communicate with another device, and a touch-screen display.

Elements of FIG. 6, and elements of other figures having the same names or reference numbers, can operate or function in the manner described herein with respect to any such figures (although the operation and function of such elements is not limited to such descriptions). For example, FIGS. 7-8 and 11-12 also depict embodiments of eNBs, hardware processing circuitry of eNBs, UEs, and/or hardware processing circuitry of UEs, and the embodiments described with respect to FIG. 6 and Figs. FIGS. 7-8 and 11-12 can operate or function in the manner described herein with respect to any of the figures.

In addition, although eNB 610 and UE 630 are each described as having several separate functional elements, one or more of the functional elements may be combined and may be implemented by combinations of software-configured elements and/or other hardware elements. In some embodiments of this disclosure, the functional elements can refer to one or more processes operating on one or more processing elements. Examples of software and/or hardware configured elements include Digital Signal Processors (DSPs), one or more microprocessors, DSPs, Field-Programmable Gate Arrays (FPGAs), Application Specific Integrated Circuits (ASICs), Radio-Frequency Integrated Circuits (RFICs), and so on.

Figure 7:
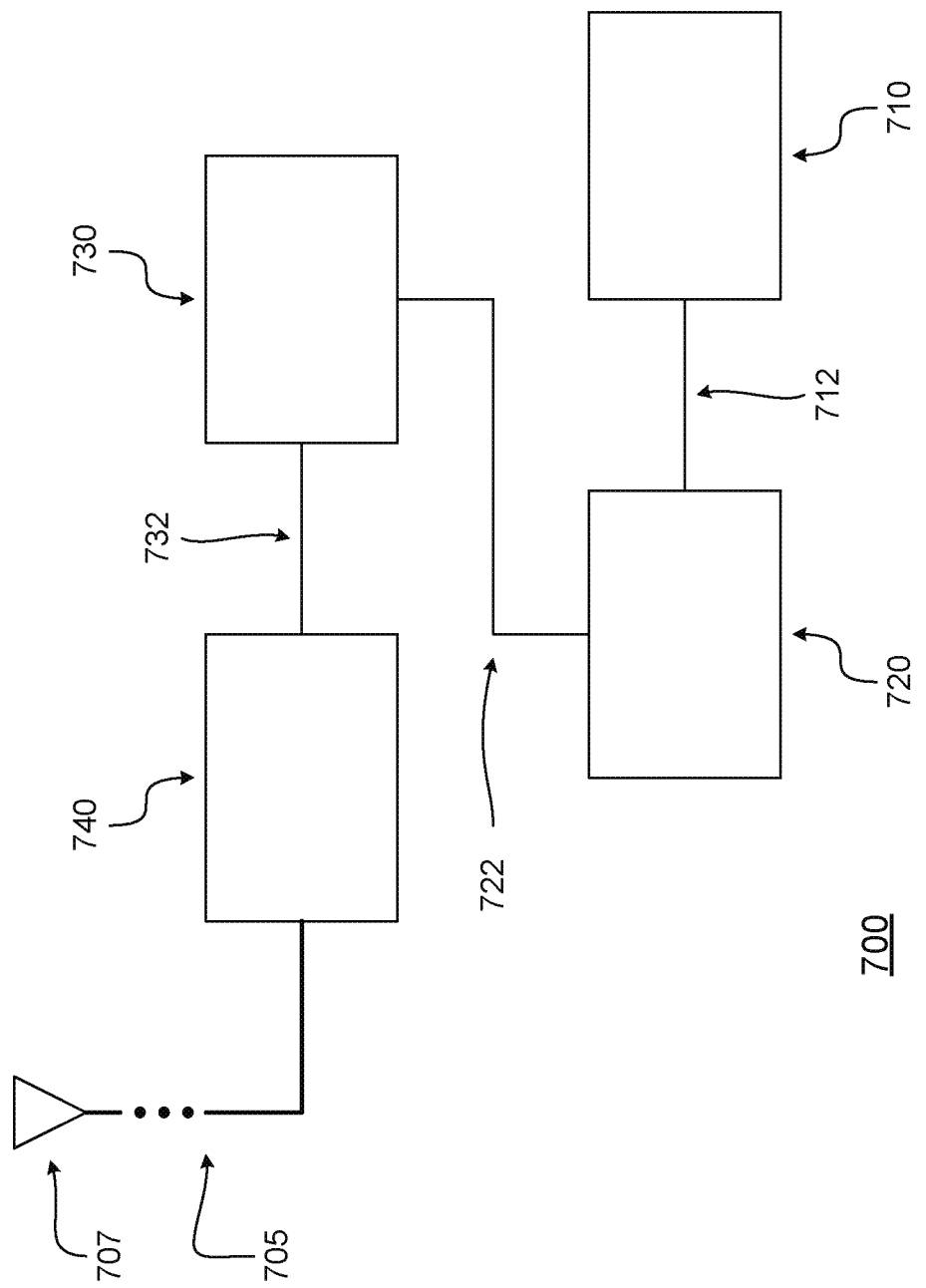
FIG. 7 illustrates hardware processing circuitries for a UE for supporting filler bit attachment in Polar encoding schemes, in accordance with some embodiments of the disclosure.

FIG. 7 illustrates hardware processing circuitries for a UE for supporting filler bit attachment in Polar encoding schemes, in accordance with some embodiments of the disclosure. With reference to FIG. 6, a UE may include various hardware processing circuitries discussed herein (such as hardware processing circuitry 700 of FIG. 7), which may in turn comprise logic devices and/or circuitry operable to perform various operations. For example, in FIG. 6, UE 630 (or various elements or components therein, such as hardware processing circuitry 640, or combinations of elements or components therein) may include part of, or all of, these hardware processing circuitries.

In some embodiments, one or more devices or circuitries within these hardware processing circuitries may be implemented by combinations of software-configured elements and/or other hardware elements. For example, processor 636 (and/or one or more other processors which UE 630 may comprise), memory 638, and/or other elements or components of UE 630 (which may include hardware processing circuitry 640) may be arranged to perform the operations of these hardware processing circuitries, such as operations described herein with reference to devices and circuitry within these hardware processing circuitries. In some embodiments, processor 636 (and/or one or more other processors which UE 630 may comprise) may be a baseband processor.

Returning to FIG. 7, an apparatus of UE 630 (or another UE or mobile handset), which may be operable to communicate with one or more eNBs on a wireless network, may comprise hardware processing circuitry 700. In some embodiments, hardware processing circuitry 700 may comprise one or more antenna ports 705 operable to provide various transmissions over a wireless communication channel (such as wireless communication channel 650). Antenna ports 705 may be coupled to one or more antennas 707 (which may be antennas 625). In some embodiments, hardware processing circuitry 700 may incorporate antennas 707, while in other embodiments, hardware processing circuitry 700 may merely be coupled to antennas 707.

Antenna ports 705 and antennas 707 may be operable to provide signals from a UE to a wireless communications channel and/or an eNB, and may be operable to provide signals from an eNB and/or a wireless communications channel to a UE. For example, antenna ports 705 and antennas 707 may be operable to provide transmissions from UE 630 to wireless communication channel 650 (and from there to eNB 610, or to another eNB). Similarly, antennas 707 and antenna ports 705 may be operable to provide transmissions from a wireless communication channel 650 (and beyond that, from eNB 610, or another eNB) to UE 630.

Hardware processing circuitry 700 may comprise various circuitries operable in accordance with the various embodiments discussed herein. With reference to FIG. 7, hardware processing circuitry 700 may comprise a first circuitry 710, a second circuitry 720, a third circuitry 730, and/or a fourth circuitry 740.

First circuitry 710 may be operable to identify a data block having a number N1 of bits. Second circuitry 720 may be operable to determine a number N2 of filler bits based on a set of one or more parameters and the N1 of bits of the data block. First circuitry 710 may be operable to provide information regarding the number N1 of bits of the data block (e.g., the number N1 itself) to second circuitry 720 via an interface 712. Third circuitry 730 may be operable to pad the data block with the N2 filler bits to form a padded data block having a number N3 of bits. Second circuitry 720 may be operable to provide information regarding the number N2 of filler bits (e.g., the number N2 itself) to third circuitry 730 via an interface 722. Fourth circuitry 740 may be operable to encode the N3 bits of the padded data block to form a Polar codeword having a number N4 of bits. Third circuitry 730 may be operable to information regarding the padded data block having the number N3 of bits (e.g., the padded data block itself) to fourth circuitry 740 via an interface 732. Hardware processing circuitry 700 may comprise an interface for sending a transmission based on the Polar codeword to a transmission circuitry.

In some embodiments, the data block may be a UCI block.

For some embodiments, second circuitry 720 may be operable to identify, based on at least the number N3, a number N5 of parity-check bits and locations at an input of a Polar encoder for the N5 parity-check bits. Second circuitry 720 may also be operable to identify N3 locations at an input of the Polar encoder for inserting the N3 bits of the padded data block. Fourth circuitry 740 may be operable to encode the N3 bits of the padded data block, the N5 parity-check bits, and a number N6 of frozen bits to form the N4 bits of the Polar codeword. Second circuitry 720 may be operable to provide the number N3 of parity-check bits and locations at the input of the Polar encoder for the N5 parity-check bits to third circuitry 730 (and through third circuitry 730, to fourth circuitry 740) via interface 722.

In some embodiments, second circuitry 720 may be operable to identify N3 locations at an input of a Polar encoder for placing the N3 bits of the padded data block, based on a sequence. Second circuitry may also be operable to identify a number N6 of locations at the input of the Polar encoder for placing N6 frozen bits, based on the sequence. Fourth circuitry 740 may be operable to encode at least the N3 bits of the padded data block and the N6 frozen bits to form the N4 bits of the Polar codeword. Second circuitry 720 may be operable to provide the number N6 of locations at the input of the Polar encoder for placing N6 frozen bits to third circuitry 730 (and through third circuitry 730, to fourth circuitry 740) via interface 722.

For some embodiments, the set of one or more parameters may comprise a set of one or more supported block sizes. In some embodiments, the one or more supported block sizes are multiples of at least one of: 2 bits, or 4 bits, or 8 bits. For some embodiments, the N2 filler bits may be concatenated to an initial bit of the data block. In some embodiments, the N2 filler bits may be concatenated to a final bit of the data block. For some embodiments, the N2 filler bits may be dispersed within the data block.

In some embodiments, first circuitry 710, second circuitry 720, third circuitry 730, and/or fourth circuitry 740 may be implemented as separate circuitries. In other embodiments, first circuitry 710, second circuitry 720, third circuitry 730, and/or fourth circuitry 740 may be combined and implemented together in a circuitry without altering the essence of the embodiments.

Figure 8:
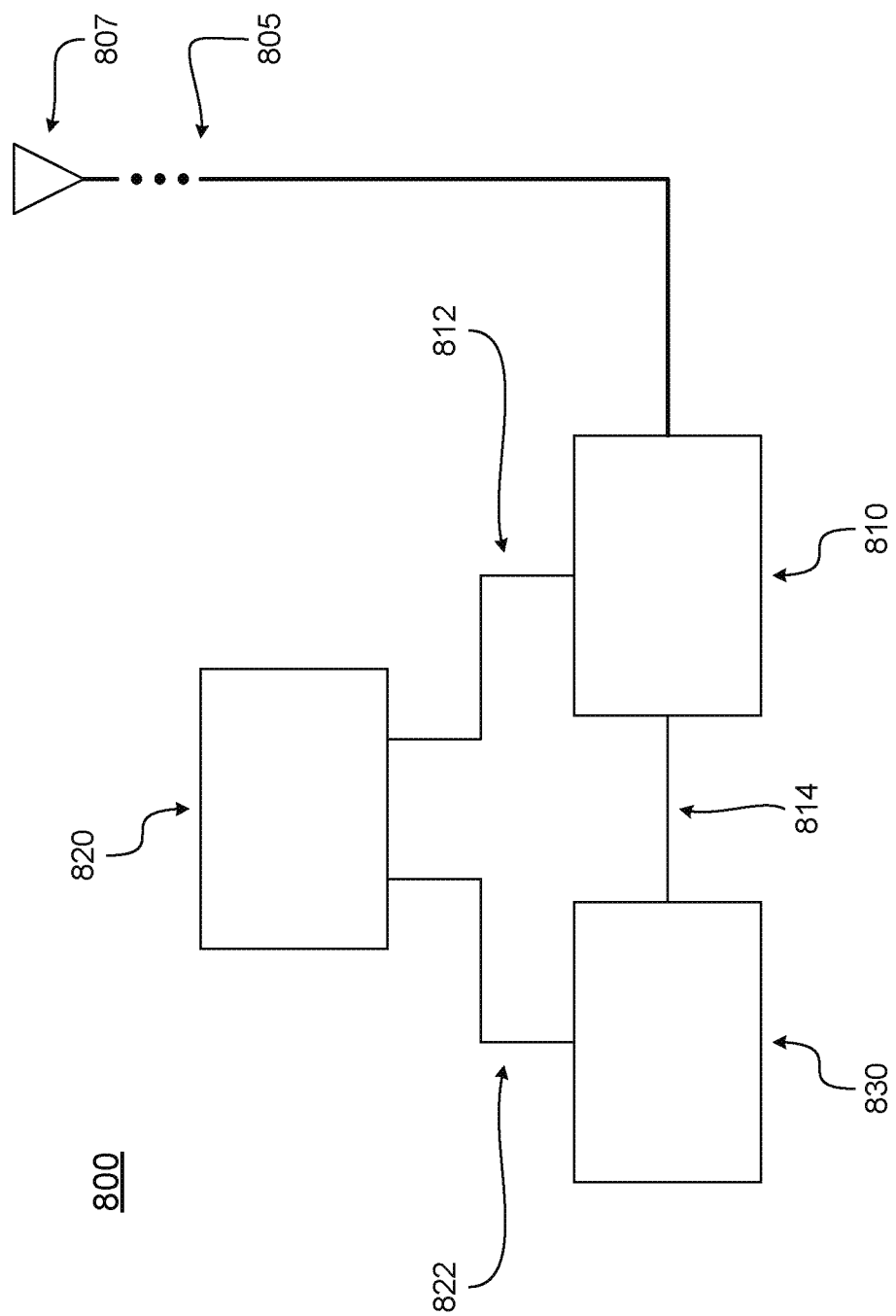
FIG. 8 illustrates hardware processing circuitries for an eNB for supporting filler bit attachment in Polar encoding schemes, in accordance with some embodiments of the disclosure.

FIG. 8 illustrates hardware processing circuitries for an eNB for supporting filler bit attachment in Polar encoding schemes, in accordance with some embodiments of the disclosure. With reference to FIG. 6, an eNB may include various hardware processing circuitries discussed herein (such as hardware processing circuitry 800 of FIG. 8), which may in turn comprise logic devices and/or circuitry operable to perform various operations. For example, in FIG. 6, eNB 610 (or various elements or components therein, such as hardware processing circuitry 620, or combinations of elements or components therein) may include part of, or all of, these hardware processing circuitries.

In some embodiments, one or more devices or circuitries within these hardware processing circuitries may be implemented by combinations of software-configured elements and/or other hardware elements. For example, processor 616 (and/or one or more other processors which eNB 610 may comprise), memory 618, and/or other elements or components of eNB 610 (which may include hardware processing circuitry 620) may be arranged to perform the operations of these hardware processing circuitries, such as operations described herein with reference to devices and circuitry within these hardware processing circuitries. In some embodiments, processor 616 (and/or one or more other processors which eNB 610 may comprise) may be a baseband processor.

Returning to FIG. 8, an apparatus of eNB 610 (or another eNB or base station), which may be operable to communicate with one or more UEs on a wireless network, may comprise hardware processing circuitry 800. In some embodiments, hardware processing circuitry 800 may comprise one or more antenna ports 805 operable to provide various transmissions over a wireless communication channel (such as wireless communication channel 650). Antenna ports 805 may be coupled to one or more antennas 807 (which may be antennas 605). In some embodiments, hardware processing circuitry 800 may incorporate antennas 807, while in other embodiments, hardware processing circuitry 800 may merely be coupled to antennas 807.

Antenna ports 805 and antennas 807 may be operable to provide signals from an eNB to a wireless communications channel and/or a UE, and may be operable to provide signals from a UE and/or a wireless communications channel to an eNB. For example, antenna ports 805 and antennas 807 may be operable to provide transmissions from eNB 610 to wireless communication channel 650 (and from there to UE 630, or to another UE). Similarly, antennas 807 and antenna ports 805 may be operable to provide transmissions from a wireless communication channel 650 (and beyond that, from UE 630, or another UE) to eNB 610.

Hardware processing circuitry 800 may comprise various circuitries operable in accordance with the various embodiments discussed herein. With reference to FIG. 8, hardware processing circuitry 800 may comprise a first circuitry 810, a second circuitry 820, and/or a third circuitry 830.

First circuitry 810 may be operable to decode a Polar codeword having a number M1 of bits to extract a padded data block having a number M2 of bits. Second circuitry 820 may be operable to determine a number M3 of filler bits based on a number M4 of bits of a data block within the padded data block and a set of one or more parameters. First circuitry 810 may be operable to provide information regarding the padded data block (e.g., the padded data block itself) to second circuitry 820 via an interface 812, and to third circuitry 830 via an interface 814. Third circuitry 830 may be operable to de-pad the M2 bits of the padded data block to form a data block having the number M4 of bits. Second circuitry 820 may be operable to information regarding the number M3 of filler bits (e.g., locations of the M3 filler bits) to third circuitry 830 via an interface 822. Hardware processing circuitry 800 may comprise an interface for receiving a transmission based on the Polar codeword from a receiving circuitry.

In some embodiments, the data block may be a UCI block.

For some embodiments, second circuitry 820 may be operable to identify, based on at least the number M2, a number M5 of parity-check bits and locations at a Polar decoder (e.g., at an output of the Polar decoder) for the M5 parity-check bits. Second circuitry 820 may also be operable to identify M2 locations at the Polar decoder (e.g., at an output of the Polar decoder) for removing the M2 bits of the padded data block. First circuitry 820 may be operable to decode, from the M1 bits of the Polar codeword, at least one of: the M2 bits of the padded data block; the M5 parity-check bits; and a number M6 of frozen bits. Second circuitry 820 may be operable to provide information regarding the number M5 of parity-check bits and locations at the Polar decoder for the M5 parity-check bits to first circuitry 810 via the interface 812.

In some embodiments, second circuitry 820 may be operable to identify M2 locations at a Polar decoder (e.g., at an output of the Polar decoder) for extracting the M2 bits of the padded data block, based on a sequence. Second circuitry 820 may also be operable to identify a number M6 of locations at the Polar decoder (e.g., at an output of the Polar decoder) for extracting M6 frozen bits, based on the sequence. First circuitry 820 may be operable to decode, from the M1 bits of the frozen codeword, at least one of: the M2 bits of the padded data block; and the M6 frozen bits. Second circuitry 820 may be operable to provide information regarding the number M6 of frozen bits at the Polar decoder to first circuitry 810 via the interface 812.

For some embodiments, the set of one or more parameters may comprise a set of one or more supported block sizes. In some embodiments, the one or more supported block sizes may be multiples of at least one of: 2 bits, or 4 bits, or 8 bits. For some embodiments, the M3 filler bits may be concatenated to an initial bit of the data block. In some embodiments, the M3 filler bits may be concatenated to a final bit of the data block. For some embodiments, the M3 filler bits may be dispersed within the data block.

In some embodiments, first circuitry 810, second circuitry 820, and/or third circuitry 830 may be implemented as separate circuitries. In other embodiments, first circuitry 810, second circuitry 820, and/or third circuitry 830 may be combined and implemented together in a circuitry without altering the essence of the embodiments.

Figure 9:
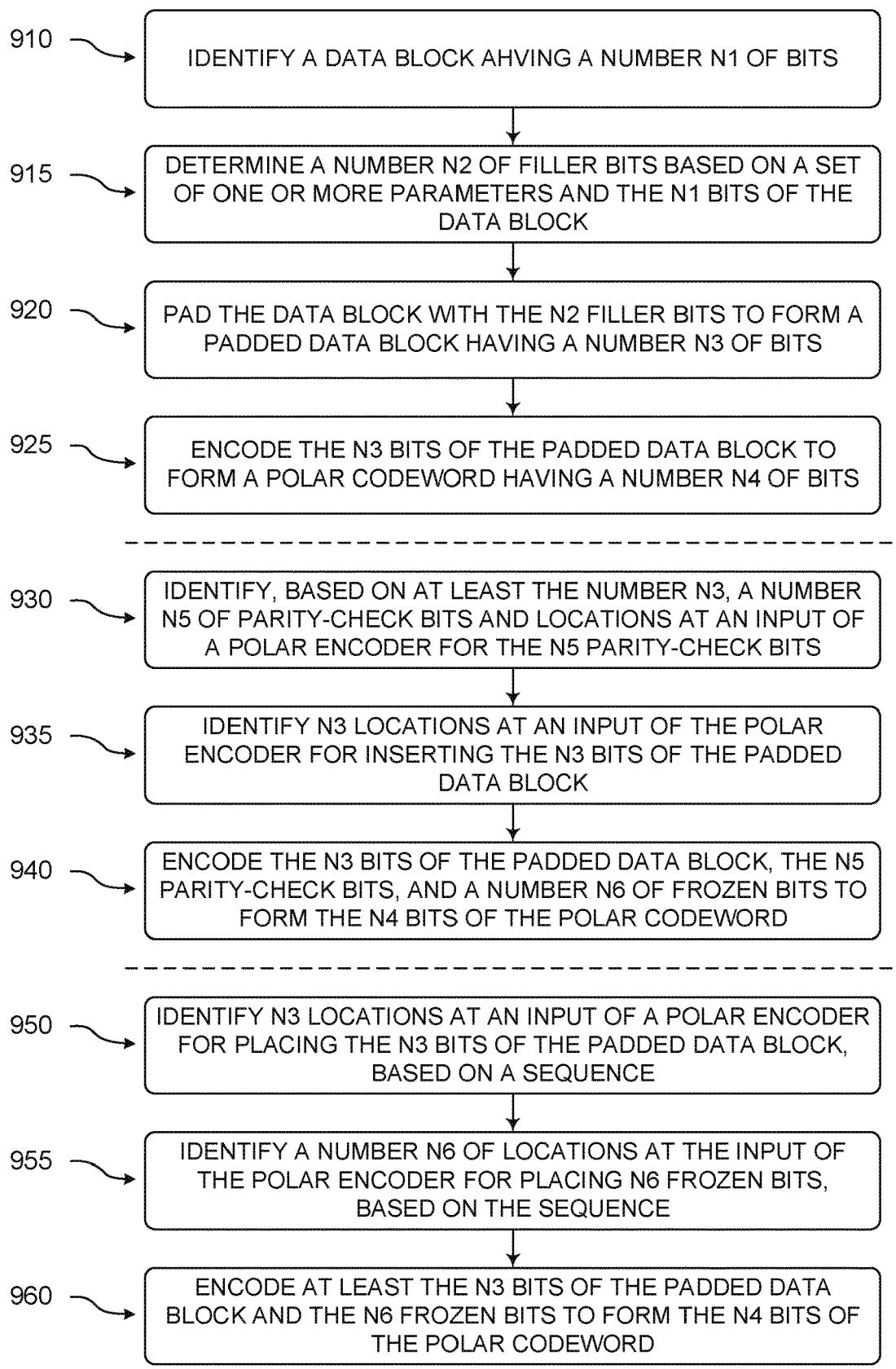
FIG. 9 illustrates methods for a UE for supporting filler bit attachment in Polar encoding schemes, in accordance with some embodiments of the disclosure.

FIG. 9 illustrates methods for a UE for supporting filler bit attachment in Polar encoding schemes, in accordance with some embodiments of the disclosure. With reference to FIG. 6, methods that may relate to UE 630 and hardware processing circuitry 640 are discussed herein. Although the actions in method 900 of FIG. 9 are shown in a particular order, the order of the actions can be modified. Thus, the illustrated embodiments can be performed in a different order, and some actions may be performed in parallel. Some of the actions and/or operations listed in FIG. 9 are optional in accordance with certain embodiments. The numbering of the actions presented is for the sake of clarity and is not intended to prescribe an order of operations in which the various actions must occur. Additionally, operations from the various flows may be utilized in a variety of combinations.

Moreover, in some embodiments, machine readable storage media may have executable instructions that, when executed, cause UE 630 and/or hardware processing circuitry 640 to perform an operation comprising the methods of FIG. 9. Such machine readable storage media may include any of a variety of storage media, like magnetic storage media (e.g., magnetic tapes or magnetic disks), optical storage media (e.g., optical discs), electronic storage media (e.g., conventional hard disk drives, solid-state disk drives, or flash-memory-based storage media), or any other tangible storage media or non-transitory storage media.

In some embodiments, an apparatus may comprise means for performing various actions and/or operations of the methods of FIG. 9.

Returning to FIG. 9, various methods may be in accordance with the various embodiments discussed herein. A method 900 may comprise an identifying 910, a determining 915, padding 920, and an encoding 925. In various embodiments, method 900 may also comprise an identifying 930, an identifying 935, an encoding 940, an identifying 950, an identifying 955, and/or an encoding 960.

In identifying 910, a data block having a number N1 of bits may be identified. In determining 915, a number N2 of filler bits may be determined based on a set of one or more parameters and the N1 of bits of the data block. In padding 920, the data block may be padded with the N2 filler bits to form a padded data block having a number N3 of bits. In encoding 925, the N3 bits of the padded data block may be encoded to form a Polar codeword having a number N4 of bits.

In some embodiments, the data block may be a UCI block.

For some embodiments, in identifying 930, based on at least the number N3, a number N5 of parity-check bits and locations at an input of a Polar encoder for the N5 parity-check bits may be identified. In identifying 935, N3 locations at an input of the Polar encoder for inserting the N3 bits of the padded data block may be identified. In encoding 940, the N3 bits of the padded data block, the N5 parity-check bits, and a number N6 of frozen bits may be encoded to form the N4 bits of the Polar codeword.

In some embodiments, in identifying 950, N3 locations at an input of a Polar encoder for placing the N3 bits of the padded data block may be identified, based on a sequence. In identifying 955, a number N6 of locations at the input of the Polar encoder for placing N6 frozen bits may be identified, based on the sequence. In encoding 960, at least the N3 bits of the padded data block and the N6 frozen bits may be encoded to form the N4 bits of the Polar codeword.

For some embodiments, the set of one or more parameters may comprise a set of one or more supported block sizes. In some embodiments, the one or more supported block sizes are multiples of at least one of: 2 bits, or 4 bits, or 8 bits. For some embodiments, the N2 filler bits may be concatenated to an initial bit of the data block. In some embodiments, the N2 filler bits may be concatenated to a final bit of the data block. For some embodiments, the N2 filler bits may be dispersed within the data block.

Figure 10:
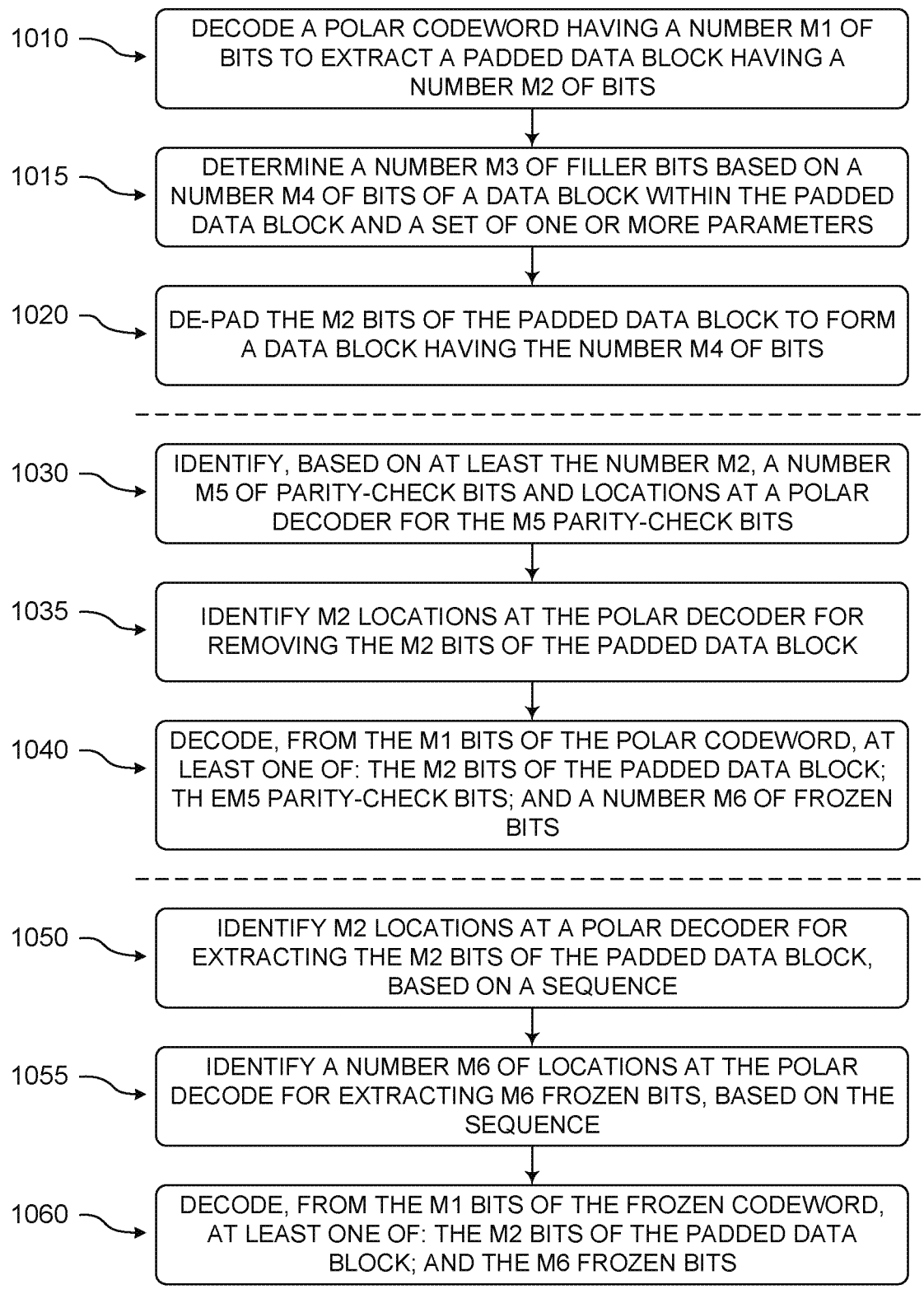
FIG. 10 illustrates methods for an eNB for supporting filler bit attachment in Polar encoding schemes, in accordance with some embodiments of the disclosure.

FIG. 10 illustrates methods for an eNB for supporting filler bit attachment in Polar encoding schemes, in accordance with some embodiments of the disclosure. With reference to FIG. 6, various methods that may relate to eNB 610 and hardware processing circuitry 620 are discussed herein. Although the actions in method 1000 of FIG. 10 are shown in a particular order, the order of the actions can be modified. Thus, the illustrated embodiments can be performed in a different order, and some actions may be performed in parallel. Some of the actions and/or operations listed in FIG. 10 are optional in accordance with certain embodiments. The numbering of the actions presented is for the sake of clarity and is not intended to prescribe an order of operations in which the various actions must occur. Additionally, operations from the various flows may be utilized in a variety of combinations.

Moreover, in some embodiments, machine readable storage media may have executable instructions that, when executed, cause eNB 610 and/or hardware processing circuitry 620 to perform an operation comprising the methods of FIG. 10. Such machine readable storage media may include any of a variety of storage media, like magnetic storage media (e.g., magnetic tapes or magnetic disks), optical storage media (e.g., optical discs), electronic storage media (e.g., conventional hard disk drives, solid-state disk drives, or flash-memory-based storage media), or any other tangible storage media or non-transitory storage media.

In some embodiments, an apparatus may comprise means for performing various actions and/or operations of the methods of FIG. 10.

Returning to FIG. 10, various methods may be in accordance with the various embodiments discussed herein. A method 1000 may comprise a decoding 1010, a determining 1015, and a de-padding 1020. In various embodiments, method 1000 may also comprise an identifying 1030, an identifying 1035, a decoding 1040, an identifying 1050, an identifying 1055, and/or a decoding 1060.

In decoding 1010, a Polar codeword having a number M1 of bits may be decoded to extract a padded data block having a number M2 of bits. In determining 1015, a number M3 of filler bits may be determined based on a number M4 of bits of a data block within the padded data block and a set of one or more parameters. In de-padding 1020, the M2 bits of the padded data block may be de-padded to form a data block having the number M4 of bits.

In some embodiments, the data block may be a UCI block.

In identifying 1030, based on at least the number M2, a number M5 of parity-check bits and locations at a Polar decoder (e.g., at an output of the Polar decoder) for the M5 parity-check bits may be identified. In identifying 1035, M2 locations at the Polar decoder (e.g., at the output of the Polar decoder) for removing the M2 bits of the padded data block may be identified. In decoding 1040, the M2 bits of the padded data block, the M5 parity-check bits, and/or a number M6 of frozen bits may be decoded from the M1 bits of the Polar codeword.

In identifying 1050, M2 locations at a Polar decoder (e.g., at the output of the Polar decoder) for extracting the M2 bits of the padded data block may be identified, based on a sequence. In identifying 1055, a number M6 of locations at the Polar decoder (e.g., at the output of the Polar decoder) for extracting M6 frozen bits may be identified, based on the sequence. In decoding 1060, the M2 bits of the padded data block and/or the M6 frozen bits may be decoded from the M1 bits of the frozen codeword.

For some embodiments, the set of one or more parameters may comprise a set of one or more supported block sizes. In some embodiments, the one or more supported block sizes may be multiples of at least one of: 2 bits, or 4 bits, or 8 bits. For some embodiments, the M3 filler bits may be concatenated to an initial bit of the data block. In some embodiments, the M3 filler bits may be concatenated to a final bit of the data block. For some embodiments, the M3 filler bits may be dispersed within the data block.

Figure 11:
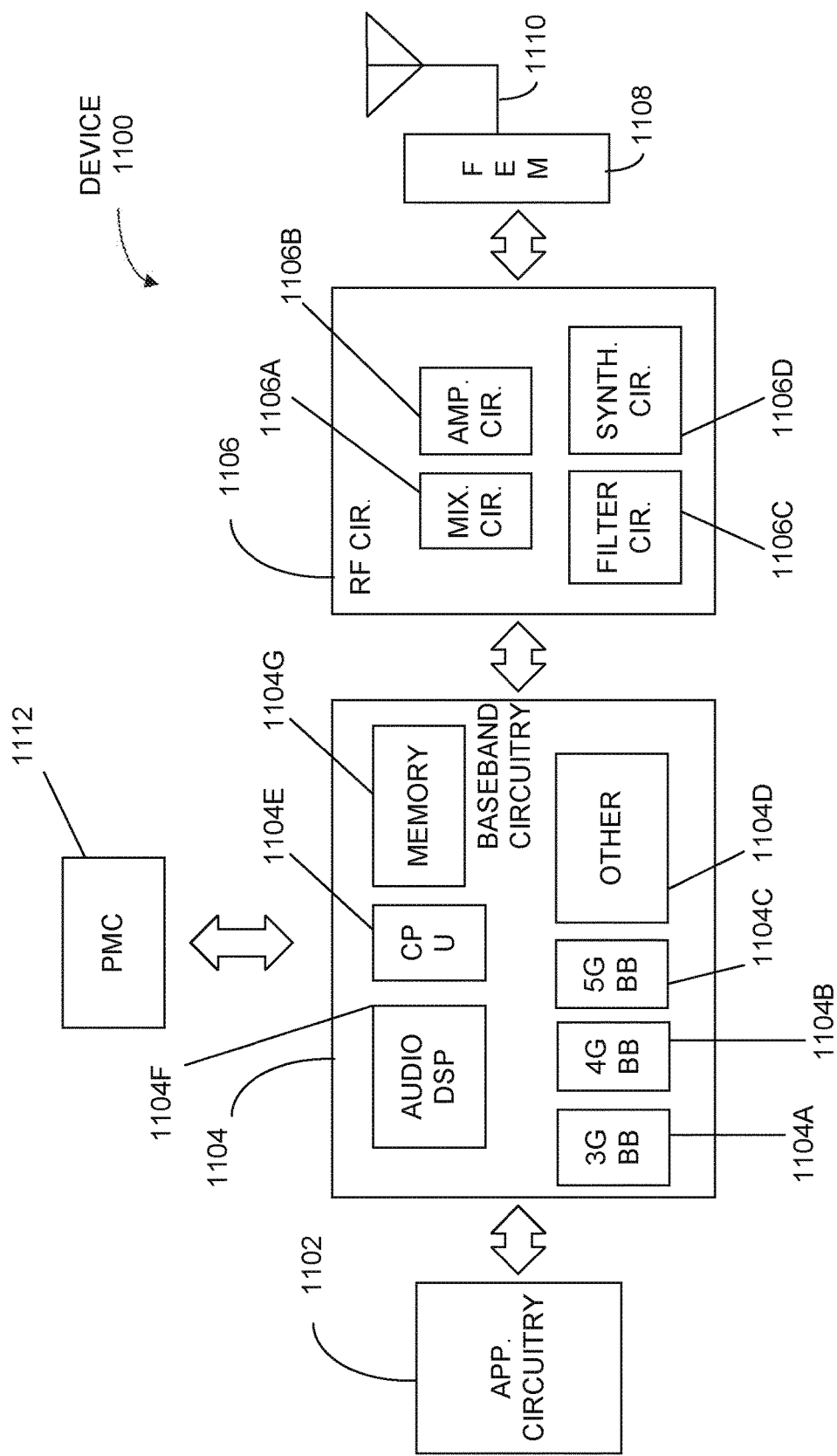
FIG. 11 illustrates example components of a device, in accordance with some embodiments of the disclosure.

FIG. 11 illustrates example components of a device, in accordance with some embodiments of the disclosure. In some embodiments, the device 1100 may include application circuitry 1102, baseband circuitry 1104, Radio Frequency (RF) circuitry 1106, front-end module (FEM) circuitry 1108, one or more antennas 1110, and power management circuitry (PMC) 1112 coupled together at least as shown. The components of the illustrated device 1100 may be included in a UE or a RAN node. In some embodiments, the device 1100 may include less elements (e.g., a RAN node may not utilize application circuitry 1102, and instead include a processor/controller to process IP data received from an EPC). In some embodiments, the device 1100 may include additional elements such as, for example, memory/storage, display, camera, sensor, or input/output (I/O) interface. In other embodiments, the components described below may be included in more than one device (e.g., said circuitries may be separately included in more than one device for Cloud-RAN (C-RAN) implementations).

The application circuitry 1102 may include one or more application processors. For example, the application circuitry 1102 may include circuitry such as, but not limited to, one or more single-core or multi-core processors. The processor(s) may include any combination of general-purpose processors and dedicated processors (e.g., graphics processors, application processors, and so on). The processors may be coupled with or may include memory/storage and may be configured to execute instructions stored in the memory/storage to enable various applications or operating systems to run on the device 1100. In some embodiments, processors of application circuitry 1102 may process IP data packets received from an EPC.

The baseband circuitry 1104 may include circuitry such as, but not limited to, one or more single-core or multi-core processors. The baseband circuitry 1104 may include one or more baseband processors or control logic to process baseband signals received from a receive signal path of the RF circuitry 1106 and to generate baseband signals for a transmit signal path of the RF circuitry 1106. Baseband processing circuitry 1104 may interface with the application circuitry 1102 for generation and processing of the baseband signals and for controlling operations of the RF circuitry 1106. For example, in some embodiments, the baseband circuitry 1104 may include a third generation (3G) baseband processor 1104A, a fourth generation (4G) baseband processor 1104B, a fifth generation (5G) baseband processor 1104C, or other baseband processor(s) 1104D for other existing generations, generations in development or to be developed in the future (e.g., second generation (2G), sixth generation (6G), and so on). The baseband circuitry 1104 (e.g., one or more of baseband processors 1104A-D) may handle various radio control functions that enable communication with one or more radio networks via the RF circuitry 1106. In other embodiments, some or all of the functionality of baseband processors 1104A-D may be included in modules stored in the memory 1104G and executed via a Central Processing Unit (CPU) 1104E. The radio control functions may include, but are not limited to, signal modulation/demodulation, encoding/decoding, radio frequency shifting, and so on. In some embodiments, modulation/demodulation circuitry of the baseband circuitry 1104 may include Fast-Fourier Transform (FFT), precoding, or constellation mapping/demapping functionality. In some embodiments, encoding/decoding circuitry of the baseband circuitry 1104 may include convolution, tail-biting convolution, turbo, Viterbi, or Low Density Parity Check (LDPC) encoder/decoder functionality. Embodiments of modulation/demodulation and encoder/decoder functionality are not limited to these examples and may include other suitable functionality in other embodiments.

In some embodiments, the baseband circuitry 1104 may include one or more audio digital signal processor(s) (DSP) 1104F. The audio DSP(s) 1104F may include elements for compression/decompression and echo cancellation and may include other suitable processing elements in other embodiments. Components of the baseband circuitry may be suitably combined in a single chip, a single chipset, or disposed on a same circuit board in some embodiments. In some embodiments, some or all of the constituent components of the baseband circuitry 1104 and the application circuitry 1102 may be implemented together such as, for example, on a system on a chip (SOC).

In some embodiments, the baseband circuitry 1104 may provide for communication compatible with one or more radio technologies. For example, in some embodiments, the baseband circuitry 1104 may support communication with an evolved universal terrestrial radio access network (EU-TRAN) or other wireless metropolitan area networks (WMAN), a wireless local area network (WLAN), a wireless personal area network (WPAN). Embodiments in which the baseband circuitry 1104 is configured to support radio communications of more than one wireless protocol may be referred to as multi-mode baseband circuitry.

RF circuitry 1106 may enable communication with wireless networks using modulated electromagnetic radiation through a non-solid medium. In various embodiments, the RF circuitry 1106 may include switches, filters, amplifiers, and so on to facilitate the communication with the wireless network. RF circuitry 1106 may include a receive signal path which may include circuitry to down-convert RF signals received from the FEM circuitry 1108 and provide baseband signals to the baseband circuitry 1104. RF circuitry 1106 may also include a transmit signal path which may include circuitry to up-convert baseband signals provided by the baseband circuitry 1104 and provide RF output signals to the FEM circuitry 1108 for transmission.

In some embodiments, the receive signal path of the RF circuitry 1106 may include mixer circuitry 1106A, amplifier circuitry 1106B and filter circuitry 1106C. In some embodiments, the transmit signal path of the RF circuitry 1106 may include filter circuitry 1106C and mixer circuitry 1106A. RF circuitry 1106 may also include synthesizer circuitry 1106D for synthesizing a frequency for use by the mixer circuitry 1106A of the receive signal path and the transmit signal path. In some embodiments, the mixer circuitry 1106A of the receive signal path may be configured to down-convert RF signals received from the FEM circuitry 1108 based on the synthesized frequency provided by synthesizer circuitry 1106D. The amplifier circuitry 1106B may be configured to amplify the down-converted signals and the filter circuitry 1106C may be a low-pass filter (LPF) or band-pass filter (BPF) configured to remove unwanted signals from the down-converted signals to generate output baseband signals. Output baseband signals may be provided to the baseband circuitry 1104 for further processing. In some embodiments, the output baseband signals may be zero-frequency baseband signals, although this is not a requirement. In some embodiments, mixer circuitry 1106A of the receive signal path may comprise passive mixers, although the scope of the embodiments is not limited in this respect.

In some embodiments, the mixer circuitry 1106A of the transmit signal path may be configured to up-convert input baseband signals based on the synthesized frequency provided by the synthesizer circuitry 1106D to generate RF output signals for the FEM circuitry 1108. The baseband signals may be provided by the baseband circuitry 1104 and may be filtered by filter circuitry 1106C.

In some embodiments, the mixer circuitry 1106A of the receive signal path and the mixer circuitry 1106A of the transmit signal path may include two or more mixers and may be arranged for quadrature downconversion and upconversion, respectively. In some embodiments, the mixer circuitry 1106A of the receive signal path and the mixer circuitry 1106A of the transmit signal path may include two or more mixers and may be arranged for image rejection (e.g., Hartley image rejection). In some embodiments, the mixer circuitry 1106A of the receive signal path and the mixer circuitry 1106A may be arranged for direct downconversion and direct upconversion, respectively. In some embodiments, the mixer circuitry 1106A of the receive signal path and the mixer circuitry 1106A of the transmit signal path may be configured for super-heterodyne operation.

In some embodiments, the output baseband signals and the input baseband signals may be analog baseband signals, although the scope of the embodiments is not limited in this respect. In some alternate embodiments, the output baseband signals and the input baseband signals may be digital baseband signals. In these alternate embodiments, the RF circuitry 1106 may include analog-to-digital converter (ADC) and digital-to-analog converter (DAC) circuitry and the baseband circuitry 1104 may include a digital baseband interface to communicate with the RF circuitry 1106.

In some dual-mode embodiments, a separate radio IC circuitry may be provided for processing signals for each spectrum, although the scope of the embodiments is not limited in this respect.

In some embodiments, the synthesizer circuitry 1106D may be a fractional-N synthesizer or a fractional N/N+1 synthesizer, although the scope of the embodiments is not limited in this respect as other types of frequency synthesizers may be suitable. For example, synthesizer circuitry 1106D may be a delta-sigma synthesizer, a frequency multiplier, or a synthesizer comprising a phase-locked loop with a frequency divider.

The synthesizer circuitry 1106D may be configured to synthesize an output frequency for use by the mixer circuitry 1106A of the RF circuitry 1106 based on a frequency input and a divider control input. In some embodiments, the synthesizer circuitry 1106D may be a fractional N/N+1 synthesizer.

In some embodiments, frequency input may be provided by a voltage controlled oscillator (VCO), although that is not a requirement. Divider control input may be provided by either the baseband circuitry 1104 or the applications processor 1102 depending on the desired output frequency. In some embodiments, a divider control input (e.g., N) may be determined from a look-up table based on a channel indicated by the applications processor 1102.

Synthesizer circuitry 1106D of the RF circuitry 1106 may include a divider, a delay-locked loop (DLL), a multiplexer and a phase accumulator. In some embodiments, the divider may be a dual modulus divider (DMD) and the phase accumulator may be a digital phase accumulator (DPA). In some embodiments, the DMD may be configured to divide the input signal by either N or N+1 (e.g., based on a carry out) to provide a fractional division ratio. In some example embodiments, the DLL may include a set of cascaded, tunable, delay elements, a phase detector, a charge pump and a D-type flip-flop. In these embodiments, the delay elements may be configured to break a VCO period up into Nd equal packets of phase, where Nd is the number of delay elements in the delay line. In this way, the DLL provides negative feedback to help ensure that the total delay through the delay line is one VCO cycle.

In some embodiments, synthesizer circuitry 1106D may be configured to generate a carrier frequency as the output frequency, while in other embodiments, the output frequency may be a multiple of the carrier frequency (e.g., twice the carrier frequency, four times the carrier frequency) and used in conjunction with quadrature generator and divider circuitry to generate multiple signals at the carrier frequency with multiple different phases with respect to each other. In some embodiments, the output frequency may be a LO frequency (fLO). In some embodiments, the RF circuitry 1106 may include an IQ/polar converter.

FEM circuitry 1108 may include a receive signal path which may include circuitry configured to operate on RF signals received from one or more antennas 1110, amplify the received signals and provide the amplified versions of the received signals to the RF circuitry 1106 for further processing. FEM circuitry 1108 may also include a transmit signal path which may include circuitry configured to amplify signals for transmission provided by the RF circuitry 1106 for transmission by one or more of the one or more antennas 1110. In various embodiments, the amplification through the transmit or receive signal paths may be done solely in the RF circuitry 1106, solely in the FEM 1108, or in both the RF circuitry 1106 and the FEM 1108.

In some embodiments, the FEM circuitry 1108 may include a TX/RX switch to switch between transmit mode and receive mode operation. The FEM circuitry may include a receive signal path and a transmit signal path. The receive signal path of the FEM circuitry may include an LNA to amplify received RF signals and provide the amplified received RF signals as an output (e.g., to the RF circuitry 1106). The transmit signal path of the FEM circuitry 1108 may include a power amplifier (PA) to amplify input RF signals (e.g., provided by RF circuitry 1106), and one or more filters to generate RF signals for subsequent transmission (e.g., by one or more of the one or more antennas 1110).

In some embodiments, the PMC 1112 may manage power provided to the baseband circuitry 1104. In particular, the PMC 1112 may control power-source selection, voltage scaling, battery charging, or DC-to-DC conversion. The PMC 1112 may often be included when the device 1100 is capable of being powered by a battery, for example, when the device is included in a UE. The PMC 1112 may increase the power conversion efficiency while providing desirable implementation size and heat dissipation characteristics.

While FIG. 11 shows the PMC 1112 coupled only with the baseband circuitry 1104. However, in other embodiments, the PMC 1112 may be additionally or alternatively coupled with, and perform similar power management operations for, other components such as, but not limited to, application circuitry 1102, RF circuitry 1106, or FEM 1108.

In some embodiments, the PMC 1112 may control, or otherwise be part of, various power saving mechanisms of the device 1100. For example, if the device 1100 is in an RRC_Connected state, where it is still connected to the RAN node as it expects to receive traffic shortly, then it may enter a state known as Discontinuous Reception Mode (DRX) after a period of inactivity. During this state, the device 1100 may power down for brief intervals of time and thus save power.

If there is no data traffic activity for an extended period of time, then the device 1100 may transition off to an RRC_Idle state, where it disconnects from the network and does not perform operations such as channel quality feedback, handover, and so on. The device 1100 goes into a very low power state and it performs paging where again it periodically wakes up to listen to the network and then powers down again. The device 1100 may not receive data in this state, in order to receive data, it must transition back to RRC_Connected state.

An additional power saving mode may allow a device to be unavailable to the network for periods longer than a paging interval (ranging from seconds to a few hours). During this time, the device is totally unreachable to the network and may power down completely. Any data sent during this time incurs a large delay and it is assumed the delay is acceptable.

Processors of the application circuitry 1102 and processors of the baseband circuitry 1104 may be used to execute elements of one or more instances of a protocol stack. For example, processors of the baseband circuitry 1104, alone or in combination, may be used execute Layer 3, Layer 2, or Layer 1 functionality, while processors of the application circuitry 1104 may utilize data (e.g., packet data) received from these layers and further execute Layer 4 functionality (e.g., transmission communication protocol (TCP) and user datagram protocol (UDP) layers). As referred to herein, Layer 3 may comprise a radio resource control (RRC) layer, described in further detail below. As referred to herein, Layer 2 may comprise a medium access control (MAC) layer, a radio link control (RLC) layer, and a packet data convergence protocol (PDCP) layer, described in further detail below. As referred to herein, Layer 1 may comprise a physical (PHY) layer of a UE/RAN node, described in further detail below.

Figure 12:
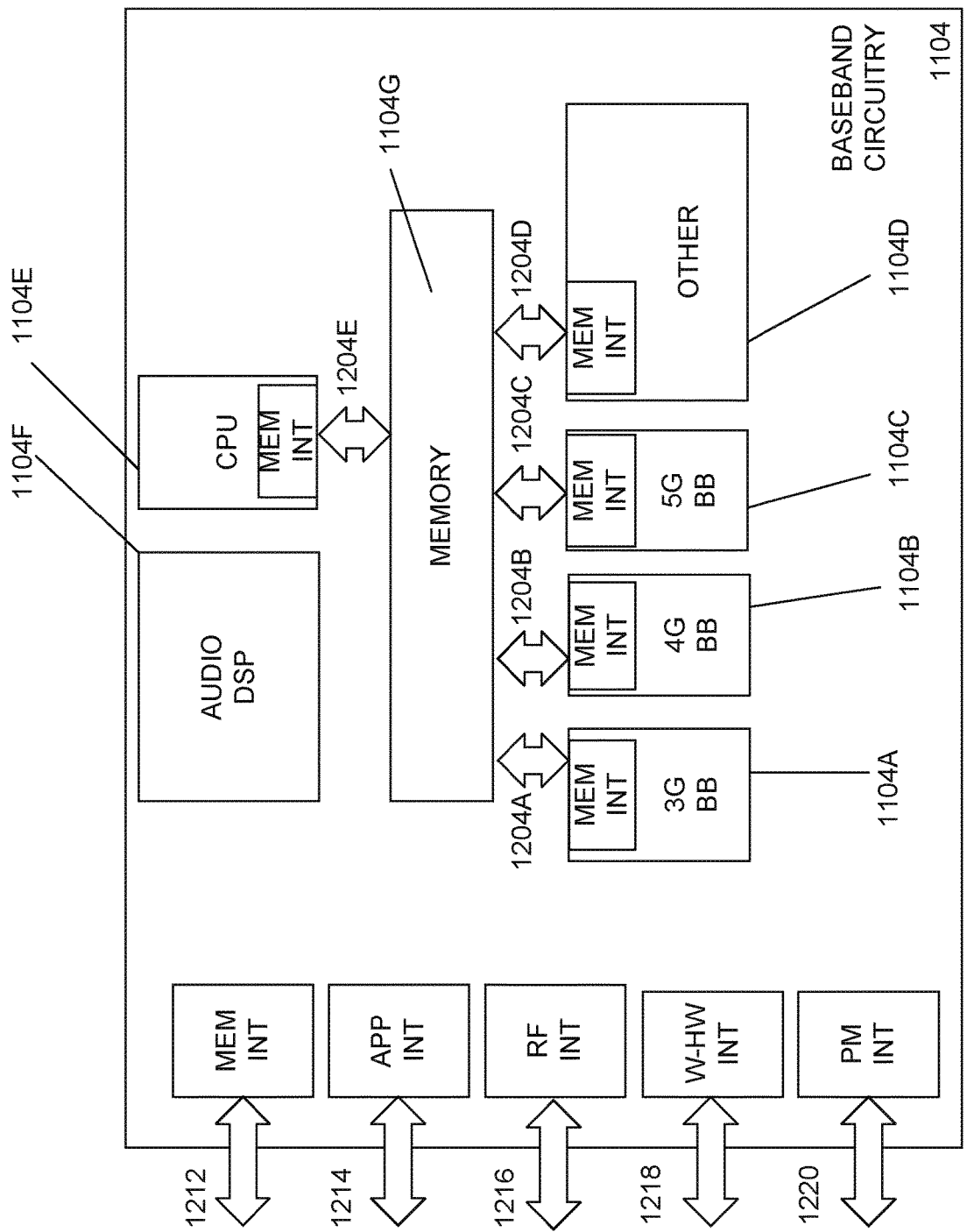
FIG. 12 illustrates example interfaces of baseband circuitry, in accordance with some embodiments of the disclosure.

FIG. 12 illustrates example interfaces of baseband circuitry, in accordance with some embodiments of the disclosure. As discussed above, the baseband circuitry 1104 of FIG. 11 may comprise processors 1104A-1104E and a memory 1104G utilized by said processors. Each of the processors 1104A-1104E may include a memory interface, 1204A-1204E, respectively, to send/receive data to/from the memory 1104G.

The baseband circuitry 1104 may further include one or more interfaces to communicatively couple to other circuitries/devices, such as a memory interface 1212 (e.g., an interface to send/receive data to/from memory external to the baseband circuitry 1104), an application circuitry interface 1214 (e.g., an interface to send/receive data to/from the application circuitry 1102 of FIG. 11), an RF circuitry interface 1216 (e.g., an interface to send/receive data to/from RF circuitry 1106 of FIG. 11), a wireless hardware connectivity interface 1218 (e.g., an interface to send/receive data to/from Near Field Communication (NFC) components, Bluetooth® components (e.g., Bluetooth® Low Energy), Wi-Fi® components, and other communication components), and a power management interface 1220 (e.g., an interface to send/receive power or control signals to/from the PMC 1112.

It is pointed out that elements of any of the Figures herein having the same reference numbers and/or names as elements of any other Figure herein may, in various embodiments, operate or function in a manner similar those elements of the other Figure (without being limited to operating or functioning in such a manner).

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

Example 1 provides an apparatus of a User Equipment (UE) operable to communicate with a Next-generation Node-B for New Radio (gNB) on a wireless network, comprising: one or more processors to: identify a data block having a number N1 of bits; determine a number N2 of filler bits based on a set of one or more parameters and the N1 of bits of the data block; pad the data block with the N2 filler bits to form a padded data block having a number N3 of bits; and encode the N3 bits of the padded data block to form a polar codeword having a number N4 of bits, and an interface for sending a transmission based on the polar codeword to a transmission circuitry.

In example 2, the apparatus of example 1, wherein the data block is an Uplink Control Information (UCI) block.

In example 3, the apparatus of any of examples 1 through 2, wherein the one or more processors are to: identify, based on at least the number N3, a number N5 of parity-check bits and locations at an input of a polar encoder for the N5 parity-check bits; identify N3 locations at an input of the polar encoder for inserting the N3 bits of the padded data block; encode the N3 bits of the padded data block, the N5 parity-check bits, and a number N6 of frozen bits to form the N4 bits of the polar codeword.

In example 4, the apparatus of any of examples 1 through 3, wherein the one or more processors are to: identify N3 locations at an input of a polar encoder for placing the N3 bits of the padded data block, based on a sequence; identify a number N6 of locations at the input of the polar encoder for placing N6 frozen bits, based on the sequence; and encode at least the N3 bits of the padded data block and the N6 frozen bits to form the N4 bits of the polar codeword.

In example 5, the apparatus of any of examples 1 through 4, wherein the set of one or more parameters comprises a set of one or more supported block sizes.

In example 6, the apparatus of example 5, wherein the one or more supported block sizes are multiples of at least one of: 2 bits, or 4 bits, or 8 bits.

In example 7, the apparatus of any of examples 1 through 6, wherein the N2 filler bits are concatenated to an initial bit of the data block.

In example 8, the apparatus of any of examples 1 through 6, wherein the N2 filler bits are concatenated to a final bit of the data block.

In example 9, the apparatus of any of examples 1 through 6, wherein the N2 filler bits are dispersed within the data block.

Example 10 provides a User Equipment (UE) device comprising an application processor, a memory, one or more antennas, a wireless interface for allowing the application processor to communicate with another device, and a touch-screen display, the UE device including the apparatus of any of examples 1 through 9.

Example 11 provides machine readable storage media having machine executable instructions that, when executed, cause one or more processors of a User Equipment (UE) operable to communicate with a Next-generation Node-B for New Radio (gNB) on a wireless network to perform an operation comprising: identify a data block having a number N1 of bits; determine a number N2 of filler bits based on a set of one or more parameters and the N1 of bits of the data block; pad the data block with the N2 filler bits to form a padded data block having a number N3 of bits; and encode the N3 bits of the padded data block to form a polar codeword having a number N4 of bits.

In example 12, the machine readable storage media of example 11, wherein the data block is an Uplink Control Information (UCI) block.

In example 13, the machine readable storage media of any of examples 11 through 12, the operation comprising: identify, based on at least the number N3, a number N5 of parity-check bits and locations at an input of a polar encoder for the N5 parity-check bits; identify N3 locations at an input of the polar encoder for inserting the N3 bits of the padded data block; encode the N3 bits of the padded data block, the N5 parity-check bits, and a number N6 of frozen bits to form the N4 bits of the polar codeword.

In example 14, the machine readable storage media of any of examples 11 through 13, the operation comprising: identify N3 locations at an input of a polar encoder for placing the N3 bits of the padded data block, based on a sequence; identify a number N6 of locations at the input of the polar encoder for placing N6 frozen bits, based on the sequence; and encode at least the N3 bits of the padded data block and the N6 frozen bits to form the N4 bits of the polar codeword.

In example 15, the machine readable storage media of any of examples 11 through 14, wherein the set of one or more parameters comprises a set of one or more supported block sizes.

In example 16, the machine readable storage media of example 15, wherein the one or more supported block sizes are multiples of at least one of: 2 bits, or 4 bits, or 8 bits.

In example 17, the machine readable storage media of any of examples 11 through 16, wherein the N2 filler bits are concatenated to an initial bit of the data block.

In example 18, the machine readable storage media of any of examples 11 through 16, wherein the N2 filler bits are concatenated to a final bit of the data block.

In example 19, the machine readable storage media of any of examples 11 through 16, wherein the N2 filler bits are dispersed within the data block.

Example 20 provides an apparatus of a Next-generation Node-B for New Radio (gNB) operable to communicate with a User Equipment (UE) on a wireless network, comprising: one or more processors to: decode a polar codeword having a number M1 of bits to extract a padded data block having a number M2 of bits; determine a number M3 of filler bits based on a number M4 of bits of a data block within the padded data block and a set of one or more parameters; and de-pad the M2 bits of the padded data block to form a data block having the number M4 of bits, and an interface for receiving a transmission based on the polar codeword from a receiving circuitry.

In example 21, the apparatus of example 20, wherein the data block is an Uplink Control Information (UCI) block.

In example 22, the apparatus of any of examples 20 through 21, wherein the one or more processors are to: identify, based on at least the number M2, a number M5 of parity-check bits and locations at a polar decoder for the M5 parity-check bits; identify M2 locations at the polar decoder for removing the M2 bits of the padded data block; and decode, from the M1 bits of the polar codeword, at least one of: the M2 bits of the padded data block; the M5 parity-check bits; and a number M6 of frozen bits.

In example 23, the apparatus of any of examples 20 through 22, wherein the one or more processors are to: identify M2 locations at a polar decoder for extracting the M2 bits of the padded data block, based on a sequence; identify a number M6 of locations at the polar decoder for extracting M6 frozen bits, based on the sequence; and decode, from the M1 bits of the frozen codeword, at least one of: the M2 bits of the padded data block; and the M6 frozen bits.

In example 24, the apparatus of any of examples 20 through 23, wherein the set of one or more parameters comprises a set of one or more supported block sizes.

In example 25, the apparatus of example 24, wherein the one or more supported block sizes are multiples of at least one of: 2 bits, or 4 bits, or 8 bits.

In example 26, the apparatus of any of examples 20 through 25, wherein the M3 filler bits are concatenated to an initial bit of the data block.

In example 27, the apparatus of any of examples 20 through 25, wherein the M3 filler bits are concatenated to a final bit of the data block.

In example 28, the apparatus of any of examples 20 through 25, wherein the M3 filler bits are dispersed within the data block.

Example 29 provides machine readable storage media having machine executable instructions that, when executed, cause one or more processors of a Next-generation Node-B for New Radio (gNB) operable to communicate with a User Equipment (UE) on a wireless network to perform an operation comprising: decode a polar codeword having a number M1 of bits to extract a padded data block having a number M2 of bits; determine a number M3 of filler bits based on a number M4 of bits of a data block within the padded data block and a set of one or more parameters; and de-pad the M2 bits of the padded data block to form a data block having the number M4 of bits.

In example 30, the machine readable storage media of example 29, wherein the data block is an Uplink Control Information (UCI) block.

In example 31, the machine readable storage media of any of examples 29 through 30, the operation comprising: identify, based on at least the number M2, a number M5 of parity-check bits and locations at a polar decoder for the M5 parity-check bits; identify M2 locations at the polar decoder for removing the M2 bits of the padded data block; and decode, from the M1 bits of the polar codeword, at least one of: the M2 bits of the padded data block; the M5 parity-check bits; and a number M6 of frozen bits.

In example 32, the machine readable storage media of any of examples 29 through 31, the operation comprising: identify M2 locations at a polar decoder for extracting the M2 bits of the padded data block, based on a sequence; identify a number M6 of locations at the polar decoder for extracting M6 frozen bits, based on the sequence; and decode, from the M1 bits of the frozen codeword, at least one of: the M2 bits of the padded data block; and the M6 frozen bits.

In example 33, the machine readable storage media of any of examples 29 through 32, wherein the set of one or more parameters comprises a set of one or more supported block sizes.

In example 34, the machine readable storage media of example 33, wherein the one or more supported block sizes are multiples of at least one of: 2 bits, or 4 bits, or 8 bits.

In example 35, the machine readable storage media of any of examples 29 through 34, wherein the M3 filler bits are concatenated to an initial bit of the data block.

In example 36, the machine readable storage media of any of examples 29 through 34, wherein the M3 filler bits are concatenated to a final bit of the data block.

In example 37, the machine readable storage media of any of examples 29 through 34, wherein the M3 filler bits are dispersed within the data block. 38, the apparatus of any of examples 1 through 9, and 20 through 28, wherein the one or more processors comprise a baseband processor.

In example 39, the apparatus of any of examples 1 through 9, and 20 through 28, comprising a memory for storing instructions, the memory being coupled to the one or more processors.

In example 40, the apparatus of any of examples 1 through 9, and 20 through 28, comprising a transceiver circuitry for at least one of: generating transmissions, encoding transmissions, processing transmissions, or decoding transmissions.

In example 41, the apparatus of any of examples 1 through 9, and 20 through 28, comprising a transceiver circuitry for generating transmissions and processing transmissions.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. A User Equipment (UE) operable to communicate with a base station (BS) on a wireless network, comprising:
   one or more processors to:
   identify a data block having a number N1 of bits;
   determine a number N2 of filler bits based on a set of one or more parameters and the N1 of bits of the data block, wherein the set of one or more parameters comprises a set of one or more supported block sizes in multiples of 2 bits, 4 bits, or 8 bits;
   pad the data block with the N2 filler bits to form a padded data block having a number N3 of bits; and
   encode the N3 bits of the padded data block to form a polar codeword having a number N4 of bits, and
   an interface for sending a transmission based on the polar codeword to a transmission circuitry.

2. The UE of claim 1, wherein the data block is an Uplink Control Information (UCI) block.

3. The UE of claim 1, wherein the one or more processors are to:
   identify, based on at least the number N3, a number N5 of parity-check bits and locations at an input of a polar encoder for the N5 parity-check bits;
   identify N3 locations at an input of the polar encoder for inserting the N3 bits of the padded data block; and
   encode the N3 bits of the padded data block, the N5 parity-check bits, and a number N6 of frozen bits to form the N4 bits of the polar codeword.

4. The UE of claim 1, wherein the one or more processors are to:
   identify N3 locations at an input of a polar encoder for placing the N3 bits of the padded data block, based on a sequence;
   identify a number N6 of locations at the input of the polar encoder for placing N6 frozen bits, based on the sequence; and
   encode at least the N3 bits of the padded data block and the N6 frozen bits to form the N4 bits of the polar codeword.

5. The UE of claim 1, wherein the N2 filler bits are concatenated to a final bit of the data block.

6. The UE of claim 1, wherein the N2 filler bits are dispersed within the data block.

7. A non-transitory computer readable medium having machine executable instructions that, when executed, cause one or more processors of a User Equipment (UE) operable to communicate with a base station (BS) on a wireless network to perform operations comprising:
identifying a data block having a number N1 of bits;
determining a number N2 of filler bits based on a set of one or more parameters and the N1 of bits of the data block, wherein the set of one or more parameters comprises a set of one or more supported block sizes in multiples of 2 bits, 4 bits, or 8 bits;
padding the data block with the N2 filler bits to form a padded data block having a number N3 of bits; and
encoding the N3 bits of the padded data block to form a polar codeword having a number N4 of bits.

8. The non-transitory computer readable medium of claim 7, wherein the data block is an Uplink Control Information (UCI) block.

9. The non-transitory computer readable medium of claim 7, the operations further comprising:
identifying, based on at least the number N3, a number N5 of parity-check bits and locations at an input of a polar encoder for the N5 parity-check bits;
identifying N3 locations at an input of the polar encoder for inserting the N3 bits of the padded data block; and
encoding the N3 bits of the padded data block, the N5 parity-check bits, and a number N6 of frozen bits to form the N4 bits of the polar codeword.

10. The non-transitory computer readable medium of claim 7, the operations further comprising:
identifying N3 locations at an input of a polar encoder for placing the N3 bits of the padded data block, based on a sequence;
identifying a number N6 of locations at the input of the polar encoder for placing N6 frozen bits, based on the sequence; and
encoding at least the N3 bits of the padded data block and the N6 frozen bits to form the N4 bits of the polar codeword.

11. The non-transitory computer readable medium of claim 7, wherein the N2 filler bits are concatenated to a final bit of the data block.

12. The non-transitory computer readable medium of claim 7, wherein the N2 filler bits are dispersed within the data block.

13. A base station (BS) operable to communicate with a User Equipment (UE) on a wireless network, comprising:
one or more processors to:
decode a polar codeword having a number M1 of bits to extract a padded data block having a number M2 of bits;
determine a number M3 of filler bits based on a number M4 of bits of a data block within the padded data block and a set of one or more parameters, wherein the set of one or more parameters comprises a set of one or more supported block sizes in multiples of 2 bits, 4 bits, or 8 bits; and
de-pad the M2 bits of the padded data block to form the data block having the number M4 of bits, and
an interface for receiving a transmission based on the polar codeword from a receiving circuitry.

14. The BS of claim 13, wherein the data block is an Uplink Control Information (UCI) block.

15. The BS of claim 13, wherein the one or more processors are to:
identify, based on at least the number M2, a number M5 of parity-check bits and locations at a polar decoder for the M5 parity-check bits;
identify M2 locations at the polar decoder for removing the M2 bits of the padded data block; and
decode, from the M1 bits of the polar codeword, at least one of: the M2 bits of the padded data block, the M5 parity-check bits, and a number M6 of frozen bits.

16. The BS of claim 13, wherein the one or more processors are to:
identify M2 locations at a polar decoder for extracting the M2 bits of the padded data block, based on a sequence;
identify a number M6 of locations at the polar decoder for extracting M6 frozen bits, based on the sequence; and
decode, from the M1 bits of the frozen codeword, at least one of: the M2 bits of the padded data block and the M6 frozen bits.

17. The BS of claim 13, wherein the M3 filler bits are concatenated to a final bit of the data block.

18. The BS of claim 13, wherein the M3 filler bits are dispersed within the data block.

19. A non-transitory computer readable medium having machine executable instructions that, when executed, cause one or more processors of a base station (BS) operable to communicate with a User Equipment (UE) on a wireless network to perform operations comprising:
decoding a polar codeword having a number M1 of bits to extract a padded data block having a number M2 of bits;
determining a number M3 of filler bits based on a number M4 of bits of a data block within the padded data block and a set of one or more parameters, wherein the set of one or more parameters comprises a set of one or more supported block sizes in multiples of 2 bits, 4 bits, or 8 bits; and
de-padding the M2 bits of the padded data block to form the data block having the number M4 of bits.

20. The non-transitory computer readable medium of claim 19, wherein the data block is an Uplink Control Information (UCI) block.

21. The non-transitory computer readable medium of claim 19, the operations further comprising:
identifying, based on at least the number M2, a number MS of parity-check bits and locations at a polar decoder for the M5 parity-check bits;
identifying M2 locations at the polar decoder for removing the M2 bits of the padded data block; and
decoding, from the M1 bits of the polar codeword, at least one of: the M2 bits of the padded data block, the M5 parity-check bits, and a number M6 of frozen bits.

22. The non-transitory computer readable medium claim 19, the operations further comprising:
identifying M2 locations at a polar decoder for extracting the M2 bits of the padded data block, based on a sequence;
identifying a number M6 of locations at the polar decoder for extracting M6 frozen bits, based on the sequence; and
decoding from the M1 bits of the frozen codeword, at least one of: the M2 bits of the padded data block and the M6 frozen bits.

23. The non-transitory computer readable medium of claim 19, wherein the M3 filler bits are concatenated to a final bit of the data block.

24. The non-transitory computer readable medium of claim 19, wherein the M3 filler bits are dispersed within the data block.

* * * * *